(12) United States Patent
Hartfiel

(10) Patent No.: US 11,520,948 B2
(45) Date of Patent: Dec. 6, 2022

(54) SYSTEMS AND METHODS FOR CREATING ELECTRONIC INDOOR MAPS

(71) Applicant: MappedIn Inc., Waterloo (CA)

(72) Inventor: Adam Hartfiel, Waterloo (CA)

(73) Assignee: MAPPEDIN INC., Waterloo (CA)

( * ) Notice: Subject to any disclaimer, the term of this patent is extended or adjusted under 35 U.S.C. 154(b) by 657 days.

(21) Appl. No.: 16/536,638

(22) Filed: Aug. 9, 2019

(65) Prior Publication Data

US 2020/0082029 A1 Mar. 12, 2020

Related U.S. Application Data

(60) Provisional application No. 62/729,057, filed on Sep. 10, 2018.

(51) Int. Cl.
*G06F 30/13* (2020.01)
*G01C 21/20* (2006.01)

(52) U.S. Cl.
CPC ........... *G06F 30/13* (2020.01); *G01C 21/206* (2013.01)

(58) Field of Classification Search
CPC ....... G01C 21/20; G01C 21/206; G06F 30/13; G06F 30/00
USPC ............................................................ 703/1
See application file for complete search history.

(56) References Cited

U.S. PATENT DOCUMENTS

2012/0065944 A1* 3/2012 Nielsen .................. G06Q 50/06
703/1

OTHER PUBLICATIONS

Saru, Kamau Salome, "Integrating Building Plans into the Existing Cadastral System", Jul. 2013, Department of Geospatial and Space Technology of the University of Nairobi. (Year: 2013).*

* cited by examiner

*Primary Examiner* — Cedric Johnson
(74) *Attorney, Agent, or Firm* — Own Innovation; James W. Hinton

(57) ABSTRACT

Systems and methods for creating electronic indoor maps from computer-assisted-design (CAD) files are disclosed. The methods involve receiving a set of CAD files relating to a facility, classifying each CAD file of the set as a site plan or a floor plan, defining one or more layers of at least one electronic map for the facility based on the set, generating an electronic map for each CAD file of the set. The electronic map includes one or more layers and each layer include at least one object. The method also involves aligning objects in the electronic map for the facility, based on the layer of the object; assigning text data in each CAD file of the set to an object in the electronic map file of that CAD file; and storing the at least one electronic map for the facility on at least one storage component.

24 Claims, 10 Drawing Sheets

SYSTEMS AND METHODS FOR CREATING ELECTRONIC INDOOR MAPS

TECHNICAL FIELD

The embodiments disclosed herein relate to electronic indoor maps and CAD floorplan geomatics, and, in particular to systems and methods for creating electronic indoor maps.

INTRODUCTION

Recent advancements in technology have transformed the ways in which people orient themselves and navigate from place to place, i.e., wayfinding. For instance, technologies such as global positioning system (GPS)-enabled devices and map applications have made outdoor wayfinding more convenient and accurate.

Despite advancements in technology related to wayfinding within a facility, i.e., facility wayfinding, many individuals navigating such facilities still rely on hardcopies of facility maps. In some cases, GPS is not viable for wayfinding. Individuals may not have access to map and/or wayfinding applications on a user device. Furthermore, individuals simply may not want to access such map and/or wayfinding application on their user device. As a result, facilities still maintain static physical signs and directories and provide printed, hardcopy facility maps. However, maintaining signs, directories, and hardcopy facility maps can be expensive, time-consuming, and provide limited wayfinding information.

SUMMARY

To help enable system users to create, edit and maintain the printable maps, a wayfinding system may provide one or more map editing tools or frameworks. The map editing tools may be part of the wayfinding system, and may be accessed, for example, via portal management module or in any other suitable way. The map editing tool may be configured to help a system user, to generate a printable map from electronic wayfinding data, such as the electronic facility maps, facility metadata, facility units, obstructions, connections, regions and the like, that can be used in the operation of the wayfinding system. The map editing tool may have any suitable configuration that can help guide and/or assist system users in creating their desired printable maps in a useful and relatively quick manner, while still being relatively easy to use and allowing a system user a relatively high degree of autonomy and design freedom in customizing the printable map.

The various embodiments described herein generally relate to methods (and associated systems configured to implement the methods) for creating electronic indoor maps from computer-assisted-design (CAD) files. The method involves operating a processor to receive a set of CAD files relating to a facility; for each CAD file of the set, classify the CAD file as a site plan or a floor plan; define one or more layers of at least one electronic map for the facility based on the set of CAD files; and for each CAD file of the set, generate an electronic map. The electronic map includes one or more layers and each layer includes at least one object. The method further involves operating the processor to align objects in the electronic map for the facility, based on the layer of the object; for each CAD file of the set, assign text data in that CAD file to an object in the electronic map file of that CAD file; and store the at least one electronic map for the facility on at least one storage component.

In some aspects, the set of CAD files can include one CAD file.

In some aspects, the set of CAD files can include a plurality of CAD files.

In some aspects, the plurality of CAD files can include a site plan and one or more floor plans.

In some aspects, operating the processor to generate an electronic map can further involve operating the processor to extract one or more CAD content from the CAD file. The one or more CAD content can include at least one layer and at least one entity. The method can also include operating the processor to classify each of the at least one layer for each CAD file as being visible or non-visible for the electronic map; determine a drawing context for the electronic map from the one or more CAD content; generate an internal data representation of the CAD file by mapping each of the at least one entity to an object in the electronic map; and draw geometry based on the internal data representation of the CAD file and the drawing context to provide the electronic map.

In some aspects, operating the processor to draw geometry based on the internal data representation of the CAD file and the drawing context to provide the electronic map can further involve operating the processor to draw geometry based on pre-defined color settings.

In some aspects, each of the at least one entity consists of a discrete element or a block insertion; and operating the processor to generate an internal data representation of the CAD file can involve operating the processor to map block insertions to block geometry collections; and map discrete elements to geometry objects, based on a class of the discrete element.

In some aspects, operating the processor to map block insertions to block geometry collections can involve operating the processor to determine an initial coordinate transform as a current coordinate transform. For each block insertion, the method can involve operating the processor to determine whether the block insertion is blacklisted; in response to determining that the block insertion is not blacklisted, dereference the block insertion to obtain a compound entity; determine whether the compound entity comprises at least one nested block insertion; and for each nested block insertion, recurse until each compound entity consists of block geometry. The method can also involve operating the processor to restore the initial coordinate transform.

In some aspects, each CAD file of the set of CAD files comprise one or more floor plans; and operating the processor to classify the CAD file can involve operating the processor to extend boundaries of a first CAD file of the set to provide a modified first CAD file, the boundaries of modified first CAD file being large enough to allow for alignment with every other CAD file of the set; and use the modified first CAD file as the site plan.

In some aspects, operating the processor to classify the CAD file can involve operating the processor to receive a latitude and longitude of the facility; retrieve satellite imagery of the latitude and longitude of the facility; and segment the facility from the retrieved satellite imagery to use as the site plan.

In some aspects, operating the processor to segment the facility from the retrieved satellite imagery segmenting the facility from the retrieved satellite imagery can involve operating the processor to segment one or more buildings from the retrieved satellite imagery; align each of the one or more segmented buildings to a floor of a CAD file in the set; and identify the segmented building having a smallest alignment difference as the facility.

In some aspects, operating the processor to identify the segmented building having a smallest alignment difference as the facility can further involve operating the processor to compare the alignment difference with a pre-determined alignment threshold; and only identify the segmented building as the facility if the alignment difference is less than the pre-determined alignment threshold.

In some aspects, operating the processor to define the one or more layers based on the set of CAD files defining the one or more layers based on the set of CAD files can further involve operating the processor to define a layer based on one or more entities detected in the CAD file, the one or more shapes representing one or more physical features of the facility.

In some aspects, operating the processor to define the one or more layers based on the set of CAD files can defining the one or more layers based on the set of CAD files further involve operating the processor to define a salient layer based on text detected in the CAD file and associated with a region within the CAD file.

In some aspects, operating the processor to classify the CAD file and define the one or more layers based on the set of CAD files can involve operating the processor to generate a site configuration file for storing the classification of files and the definition of one or more layers and store the site configuration file on the at least one storage component.

In some aspects, operating the processor to align the position of objects in the at least one electronic map for the facility, based on the layer of the object can involve operating the processor to identify common geometry objects that are common to the site plan and one or more floor plans; render an image of the site plan using a first scaling factor to draw the common geometry objects. For each floor plan, the method can involve operating the processor to render an image of the floor plan using the first scaling factor to draw the common geometry objects; determine a transformation that aligns the image of the floor plan with the image of the site plan; and apply the transformation to each common geometry object of the floor plan in the electronic map.

In some aspects, operating the processor to determine a transformation that aligns the image of the floor plan with the image of the site plan can involve operating the processor to use a Fourier-Mellin transform to generate a polar spectrum decomposition; locate a largest peak in the polar spectrum decomposition; and use a rotation, location, and scaling factor at the largest peak as the transformation that aligns the image of the floor plan with the image of the site plan.

In some aspects, operating the processor to assign text data in the CAD file to an object in the electronic map for that CAD file can involve operating the processor to extract one or more closed polygons from the floor plan; extract one or more text strings from the floor plan, each text string comprising a location identifier; and associate each of the one or more location identifiers with a polygon of the one or more polygons.

In some aspects, operating the processor to associate each of the one or more location identifiers with a closed polygon of the one or more closed polygons comprises operating the processor to assign each location identifier to a polygon with at least one of minimal distance and maximal overlap.

In another broad aspect, a system for creating an electronic map for a facility from computer-assisted-design (CAD) files is disclosed. The system includes at least one storage component at least one storage component for storing at least one electronic map for the facility, a communication component to transmit data via a communication network, and a processor operatively coupled to the at least one storage component and the communication component. The at least one electronic map includes one or more layers and each layer includes at least one object. The communication component can transmit a set of CAD files relating to the facility and the at least one electronic map for the facility. The processor is configured for receiving the set of CAD files relating to the facility; classifying each CAD file of the set as a site plan or a floor plan; defining the one or more layers based on the set of CAD files; and generating an electronic map for each CAD file of the set. The processor is also configured for aligning objects in the at least one electronic map for the facility, based on the layer of the object; for each CAD file of the set, assigning text data in that CAD file to an object in the electronic map for that CAD file; and storing, on the at least one storage component, the at least one electronic map for the facility.

In some aspects, the set of CAD files can include one CAD file.

In some aspects, the set of CAD files can include a plurality of CAD files.

In some aspects, the plurality of CAD files can include a site plan and one or more floor plans.

In some aspects, the processor being configured for generating an electronic map can further include the processor being configured for extracting one or more CAD content from the CAD file. The one or more CAD content can include at least one layer and at least one entity. The processor can be further configured for each of the at least one layer, classifying the layer as being visible or non-visible for the electronic map; determining a drawing context for the electronic map from the one or more CAD content; generating an internal data representation of the CAD file by mapping each of the at least one entity to an object in the electronic map; and drawing geometry based on the internal data representation of the CAD file and the drawing context to provide the electronic map.

In some aspects, the processor being configured for drawing geometry based on the internal data representation of the CAD file and the drawing context to provide the electronic map can further include the processor being configured for drawing geometry based on pre-defined color settings.

In some aspects, each of the at least one entity can consist of a discrete element or a block insertion; and the processor being configured for generating an internal data representation of the CAD file can include the processor being configured for mapping block insertions to block geometry collections; and mapping discrete elements to geometry objects, based on a class of the discrete element.

In some aspects, the processor being configured for mapping block insertions to block geometry collections can include the processor being configured for determining an initial coordinate transform as a current coordinate transform and for each block insertion: determining whether the block insertion is blacklisted; in response to determining that the block insertion is not blacklisted, dereferencing the block insertion to obtain a compound entity; determining whether the compound entity comprises at least one nested block insertion; and for each nested block insertion, recursing until each compound entity consists of block geometry. The processor can be further configured for restoring the initial coordinate transform.

In some aspects, each CAD file of the set of CAD files can include one or more floor plans; and the processor being configured for classifying the CAD file can include the processor being configured for extending boundaries of a first CAD file of the set to provide a modified first CAD file, the boundaries of modified first CAD file being large enough to allow for alignment with every other CAD file of the set; and using the modified first CAD file as the site plan.

In some aspects, the processor being configured for classifying the CAD file can include the processor being configured for receiving a latitude and longitude of the facility; retrieving satellite imagery of the latitude and longitude of the facility; and segmenting the facility from the retrieved satellite imagery to use as the site plan.

In some aspects, the processor being configured for segmenting the facility from the retrieved satellite imagery can include the processor being configured for segmenting one or more buildings from the retrieved satellite imagery; aligning each of the one or more segmented buildings to a floor of a CAD file in the set; and identifying the segmented building having a smallest alignment difference as the facility.

In some aspects, the processor being configured for identifying the segmented building having a smallest alignment difference as the facility can further include the processor being configured for: comparing the alignment difference with a pre-determined alignment threshold; and only identifying the segmented building as the facility if the alignment difference is less than the pre-determined alignment threshold.

In some aspects, the processor being configured for defining the one or more layers based on the set of CAD files can further include the processor being configured for defining a layer based on one or more entities detected in the CAD file, the one or more shapes representing one or more physical features of the facility.

In some aspects, the processor being configured for defining the one or more layers based on the set of CAD files can further include the processor being configured for defining a salient layer based on text detected in the CAD file and associated with a region within the CAD file.

In some aspects, the processor being configured for classifying the CAD file and defining the one or more layers based on the set of CAD files can include the processor being configured for generating a site configuration file, the site configuration file storing the classification of files and the definition of one or more layers.

In some aspects, the processor being further configured for aligning objects in the at least one electronic map for the facility, based on the layer of the object can include the processor being configured for identifying common geometry objects that are common to the site plan and one or more floor plans; rendering an image of the site plan using a first scaling factor to draw the common geometry objects. For each floor plan, the processor can be configured for rendering an image of the floor plan using the first scaling factor to draw the common geometry objects; determining a transformation that aligns the image of the floor plan with the image of the site plan; and applying the transformation to each common geometry object of the floor plan in the electronic map.

In some aspects, the processor being further configured for determining a transformation that aligns the image of the floor plan with the image of the site plan can include the processor being configured for using a Fourier-Mellin transform to generate a polar spectrum decomposition; locating a largest peak in the polar spectrum decomposition; and using a rotation, location, and scaling factor at the largest peak as the transformation that aligns the image of the floor plan with the image of the site plan.

In some aspects, the processor being further configured for assigning text data in that CAD file to an object in the electronic map for that CAD file can include the processor being configured for extracting one or more closed polygons from the floor plan; extracting one or more text strings from the floor plan, each text string comprising a location identifier; and associating each of the one or more location identifiers with a polygon of the one or more polygons.

In some aspects, the processor being further configured for associating each of the one or more location identifiers with a closed polygon of the one or more closed polygons can include the processor being configured for assigning each location identifier to a polygon with at least one of minimal distance and maximal overlap.

Other aspects and features will become apparent, to those ordinarily skilled in the art, upon review of the following description of some exemplary embodiments.

BRIEF DESCRIPTION OF THE DRAWINGS

The drawings included herewith are for illustrating various examples of articles, methods, and apparatuses of the present specification. In the drawings.

DETAILED DESCRIPTION

Figure 1:
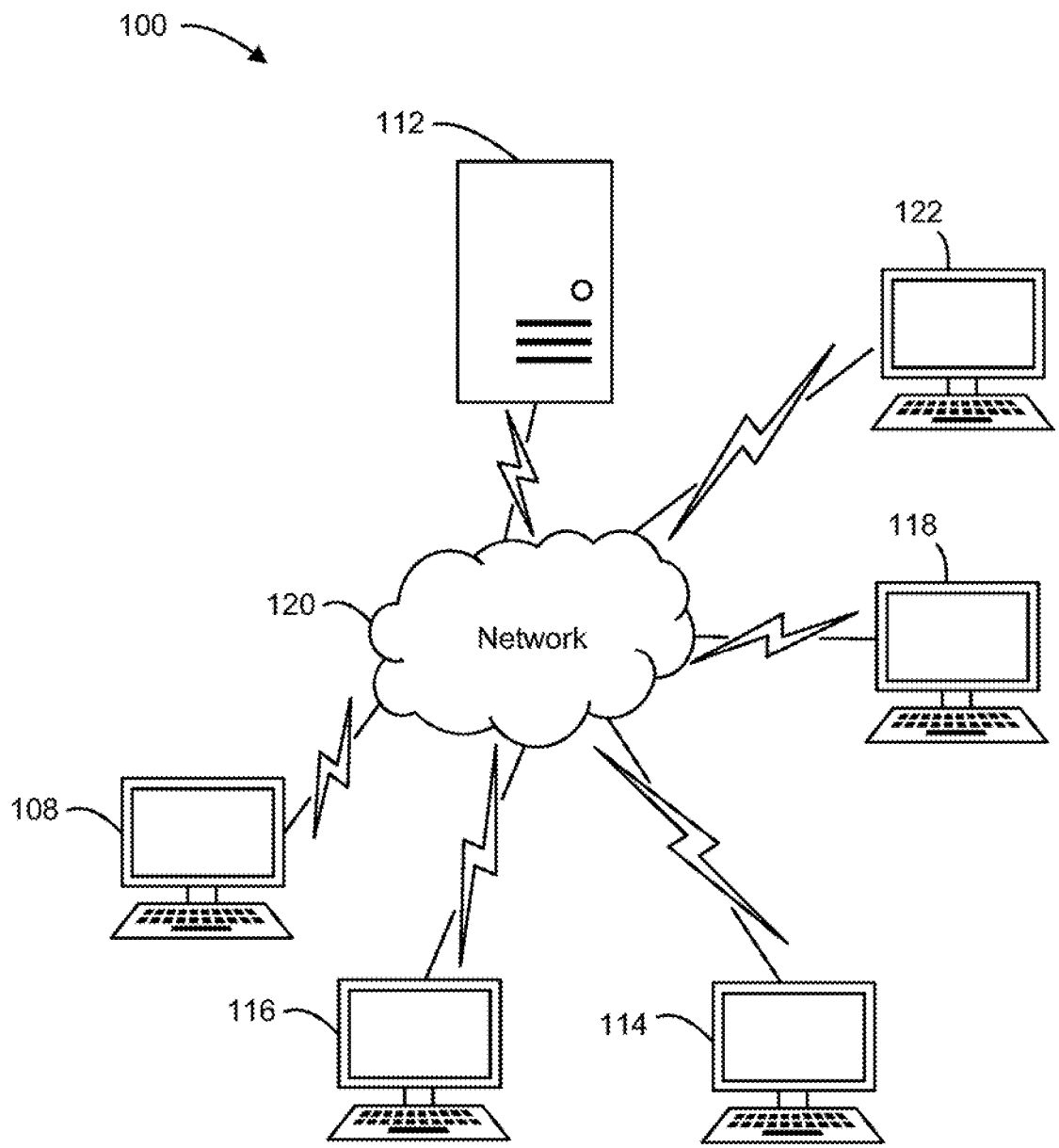
FIG. 1 is a diagram of a wayfinding system, in accordance with at least one embodiment.

Various apparatuses or processes will be described below to provide an example of each claimed embodiment. No embodiment described below limits any claimed embodiment and any claimed embodiment may cover processes or apparatuses that differ from those described below. The claimed embodiments are not limited to apparatuses or processes having all of the features of any one apparatus or process described below or to features common to multiple or all of the apparatuses described below.

One or more systems described herein may be implemented in computer programs executing on programmable computers, each comprising at least one processor, a data storage system (including volatile and non-volatile memory and/or storage elements), at least one input device, and at least one output device. For example, and without limitation, the programmable computer may be a programmable logic unit, a mainframe computer, server, and personal computer, cloud based program or system, laptop, personal data assistance, cellular telephone, smartphone, or tablet device.

Each program is preferably implemented in a high level procedural or object oriented programming and/or scripting language to communicate with a computer system. However, the programs can be implemented in assembly or machine language, if desired. In any case, the language may be a compiled or interpreted language. Each such computer program is preferably stored on a storage media or a device readable by a general or special purpose programmable computer for configuring and operating the computer when the storage media or device is read by the computer to perform the procedures described herein.

A description of an embodiment with several components in communication with each other does not imply that all such components are required. On the contrary, a variety of optional components is described to illustrate the wide variety of possible embodiments of the present invention.

Further, although process steps, method steps, algorithms or the like may be described (in the disclosure and/or in the claims) in a sequential order, such processes, methods and algorithms may be configured to work in alternate orders. In other words, any sequence or order of steps that may be described does not necessarily indicate a requirement that the steps be performed in that order. The steps of processes described herein may be performed in any order that is practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article.

Computer-assisted-design (CAD) source files for building floor plans and site plans contain syntactic and/or semantic information. Syntactic information can be reflected in the line and shapes used to represent physical features in the CAD source file. Semantic information can be reflected in the text included in the CAD source file. For example, the CAD source file can include annotations to indicate that a wall should be made of concrete, or should be built at some location. The syntactic and/or semantic information of CAD source files can be extracted to generate navigable electronic maps for wayfinding within a facility.

FIG. 1 shows a block diagram illustrating one exemplary embodiment of a wayfinding system 100 for creating navigable electronic maps, in accordance with some embodiments. The wayfinding system 100 is for a facility including multiple objects i.e., a facility wayfinding system. The wayfinding system 100 is not restricted to a single facility, but may be extended to multiple facilities of the same type and/or different types, each including multiple objects. Examples of objects that may be included in a given facility can include facility units, obstructions, connections, regions and the like. For the purposes of this description, facility units may be configured as stores, rooms and other types of identifiable, generally bounded structures that may form a part of a larger facility.

For example, stores within a shopping center, offices within a commercial office building, classrooms within a school, patient rooms within a hospital, bathrooms inside other structures and the like. Obstructions may be objects that are generally not traversable by the wayfinding system 100 end users and that may tend to impede navigation throughout the facility. Examples of obstructions can include tables, benches, shelves, beds, other furniture, fountains, sculptures and other objects that are placed within a facility or facility unit but typically do not form part of the structure of the facility or facility unit. Connections may be portions of a facility or facility unit that extend between, and connect, two or more traversable areas within the wayfinding system 100. Examples of connections may include hallways, walkways, staircases, elevators, escalators, ramps, moving walkways and the like. Regions may be regions of the facility and/or a facility unit that are generally open, at least partially traversable areas that are not bounded by walls. Examples of regions can include, atriums, foyers, event spaces, stages, open floor area in a store, concourses, public squares, courtyards and the like.

The wayfinding system 100 allows users, e.g., visitors to the facility, to orient themselves and to navigate from place to place within the facility, enabling them to find what they are looking for and to discover things around them. For example, a shopper at a mall can use the wayfinding system 100 to search for a particular store or a particular item or class of items (e.g., shoes), navigate to the relevant location, and/or look at the current promotions.

The facility may be any type of facility, and may include a single building or two or more separate buildings, each of which may include any suitable facility units and other objects. Typically, the facility is a commercial facility or an institutional facility. For example, the facility may be a retail facility, e.g., a mall or a shopping center, an office facility, e.g., an office building, an event facility, e.g., a conference center, an amusement park, or a theme park, a transportation facility, e.g., an airport, or a bus terminal, an educational facility, e.g., a school or a university campus, or a medical facility, e.g., a hospital. The facility may be an indoor, an outdoor facility and/or may include a combination of indoor and outdoor portions. However, the wayfinding systems described herein may be particularly useful for indoor facilities and/or facilities with at least some indoor portions.

The facility units in a given facility may be any type of suitable facility units. For example, the facility units may be commonly managed as part of the facility. Some examples of facility units include stores, restaurants, booths, offices, rooms, halls, washrooms, airport gates, and/or locations or areas within the facility. A given facility may include only a single type of facility units, or alternatively a facility may include a mixture of different types of facility units.

The wayfinding system 100 may include a facility wayfinding system, such as those described in U.S. Pat. No. 9,702,706, which is hereby incorporated by reference in its entirety.

In the illustrated example, the wayfinding system 100 includes a server platform 112, which communicates with a plurality of store devices 114, a plurality of facility devices 116, a plurality of administrator devices 118, and a plurality of emergency service provider devices 108 via a communication network 120. The server platform 112 also communicates with a plurality of visitor devices 122. The server platform 112 may be a purpose built machine designed specifically for implementing a system and method for indoor navigation.

The server platform 112, store devices 114, facility devices 116, administrator devices 118, emergency service provider devices 108, and visitor devices 122 may be a server computer, desktop computer, notebook computer, tablet, PDA, smartphone, or another computing device. The devices 112, 108, 114, 116, 118, and 122 may include a connection with the communication network 120 such as a wired or wireless connection to the Internet. In some cases, the communication network 120 may include other types of computer or telecommunication networks. The devices 112, 108, 114, 116, 118, and 122 may include one or more of a memory, a secondary storage device, a storage component, a processor, an input device, a display device, and an output device. Memory may include random access memory (RAM) or similar types of memory. Also, memory may store one or more applications for execution by the processor. Applications may correspond with software modules comprising computer executable instructions to perform processing for the functions described below. Secondary storage devices may include a hard disk drive, floppy disk drive, CD drive, DVD drive, Blu-ray drive, or other types of non-volatile data storage.

The processor of each of devices 112, 108, 114, 116, 118, and 122 may execute applications, computer readable instructions or programs. The applications, computer readable instructions or programs may be stored in memory or in secondary storage, or may be received from the Internet or other communication network 120. Input device may include any device for entering information into device 112, 108, 114, 116, 118, and 122. For example, input device may be a keyboard, key pad, cursor-control device, touch-screen, camera, or microphone. Display device may include any type of device for presenting visual information. For example, display device may be a computer monitor, a flat-screen display, a projector or a display panel. Output device may include any type of device for presenting a hard copy of information, such as a printer for example. Output device may also include other types of output devices such as speakers, for example. In some cases, device 112, 108, 114, 116, 118, and 122 may include multiple of any one or more of processors, applications, software modules, second storage devices, network connections, input devices, output devices, and display devices.

Although devices 112, 108, 114, 116, 118, and 122 are described with various components, one skilled in the art will appreciate that the devices 112, 108, 114, 116, 118, and 122 may in some cases contain fewer, additional or different components. In addition, although aspects of an implementation of the devices 112, 114, 116, 118, 108, and 122 may be described as being stored in memory, one skilled in the art will appreciate that these aspects can also be stored on or read from other types of computer program products or computer-readable media, such as secondary storage devices, including hard disks, floppy disks, CDs, or DVDs; a carrier wave from the Internet or other communication network; or other forms of RAM or ROM. The computer-readable media may include instructions for controlling the devices 112, 108, 114, 116, 118, and 122 and/or processor to perform a particular method.

In the description that follows, devices such as server platform 112, store devices 114, facility devices 116, administrator devices 118, emergency service provider devices 108, and visitor devices 122 are described performing certain acts. It will be appreciated that any one or more of these devices may perform an act automatically or in response to an interaction by a user of that device. That is, the user of the device may manipulate one or more input devices (e.g. a touchscreen, a mouse, or a button) causing the device to perform the described act. In many cases, this aspect may not be described below, but it will be understood.

As an example, it is described below that the devices 108, 114, 116, 118, and 122 may send information to and receive information from the server platform 112. For example, a store user using the store device 114 may manipulate one or more input devices (e.g. a mouse and a keyboard) to interact with a user interface displayed on a display of the store device 114 to respond to questions. Generally, the device may receive a user interface from the communication network 120 (e.g. in the form of a webpage). Alternatively or in addition, a user interface may be stored locally at a device (e.g. a cache of a webpage or a mobile application).

Server platform 112 may be configured to receive a plurality of information, from each of the plurality of store devices 114, facility devices 116, administrator devices 118, emergency service provider devices 108, and visitor devices 122. The store devices 114, facility devices 116, administrator devices 118, emergency service provider devices 108, and visitor devices 122 are herein referred to as user computing devices, or computing devices. Generally, the information may comprise at least an identifier identifying the user who may be associated with a store, associated with a facility, an administrator of the system, an emergency service provider of the facility, or visitor of the store or facility. For example, the information may comprise one or more of a username, e-mail address, password, or social media handle.

In response to receiving information, the server platform 112 may store the information in a storage database. The storage database may correspond with secondary storage of the device 112, 114, 116, 118, and 122. Generally, the storage database may be any suitable storage device such as a hard disk drive, a solid state drive, a memory card, or a disk (e.g. CD, DVD, or Blu-ray etc.). Also, the storage database may be locally connected with server platform 112. In some cases, storage database may be located remotely from server platform 112 and accessible to server platform 112 across the communication network 120 for example. In some cases, storage database may comprise one or more storage devices located at a networked cloud storage provider.

The store device 114 may be associated with a store account. Similarly, the facility device 16 may be associated with a facility account, the administrator device 118 may be associated with an administrator account, the emergency service provider device 108 may be associated with an emergency service provider (i.e., first responders) account, and the visitor device 122 may be associated with a visitor account. Any suitable mechanism for associating a device with an account is expressly contemplated. In some cases, a device may be associated with an account by sending credentials (e.g. a cookie, login, or password etc.) to the server platform 112. The server platform 112 may verify the credentials (e.g. determine that the received password matches a password associated with the account). If a device is associated with an account, the server platform 112 may consider further acts by that device to be associated with that account.

The devices 108, 114, 116, 118, and 122 and the server platform 112 may communicate asynchronously, for example, by using an implementation of the WebSocket protocol, such as Socket.IO. Updates may be sent from the server platform 112 to each of the devices 108, 114, 116, 118, and 122 in real time as interrupts, i.e., without polling. Likewise, user interaction data may be sent from each of the devices 108, 114, 116, 118, and 122 to the server platform 112 in real time as interrupts, i.e., without polling.

Figure 2:
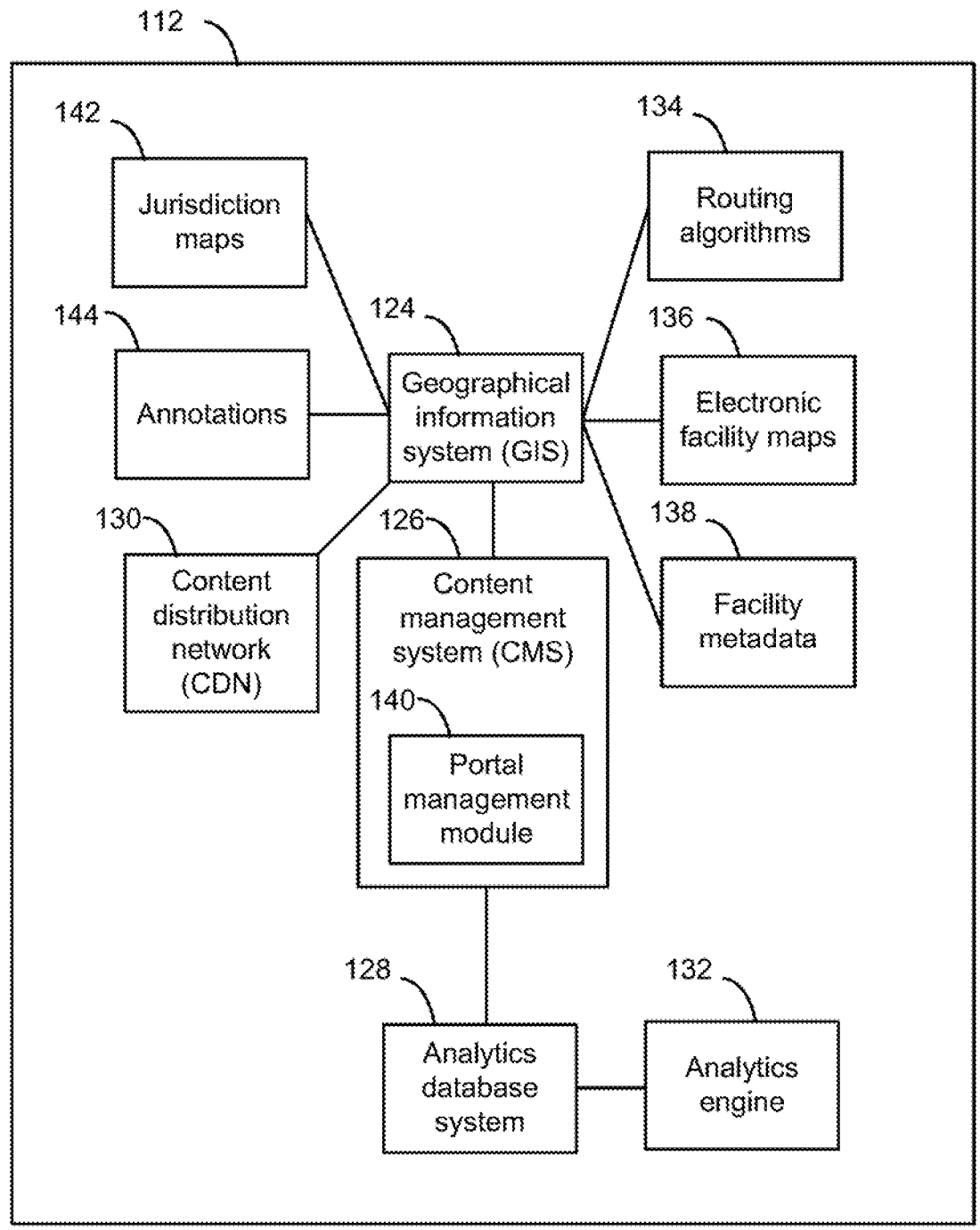
FIG. 2 is a block diagram of a server platform of the wayfinding system of FIG.

Turning now to FIG. 2, illustrated therein is the server platform 112, in accordance with an embodiment. The server platform 112 includes a content management system (CMS) 126, an analytics database system 128, and a geographical information system (GIS) 124. The server platform 112 may include multiple backend devices, e.g., servers. The server platform 112 may include at least a database server and a hosting server. In some instances, the server platform 112 also includes a content distribution network (CDN) 130. The CMS 126 and the analytics database system 128 may be hosted by the server platform 112. The GIS 124 may be hosted internally by the server platform 112 or supplied externally. In some embodiments, each of the GIS 124, CMS 126, analytics database system 128, CDN 130, analytics engine 132, and portal management module 140 may be combined into a fewer number of components or may be separated into further components.

In some embodiments, the CMS 126 may be a front end interface application, typically, implemented as a web service. CMS 126 may communicate with GIS 124, which then modifies the database. In this case, GIS 124 may be an Application Program Interface (API), which manipulates the database.

In some embodiments, CMS 126 stores content, including information relating to the facility and the facility units, handles updates to the content received from the devices 108, 114, 116, 118, and 122, and provides content to the devices 108, 114, 116, 118, and 122. For example, the CMS 126 may be a no structured query language (NoSQL) database application. The content stored in the CMS 126 is customizable for the type of facility. Typically, the information stored for each facility unit includes a profile, a link to a webpage and/or link to a social media page, a photograph, directory information, e.g., a phone number and/or an address, opening hours, event information, promotional information, e.g., an advertisement and/or a marketing message, and/or a promotional item, e.g., a digital coupon. Often, the information relating to the facility and the facility units may be tied to a related entry in the facility metadata 138 stored in the GIS 124. This may allow larger, less frequently accessed files to be stored in the CMS 126, rather than the GIS 124.

In some embodiments, the analytics database system 128 includes or is operatively connected to an analytics engine 132. The analytics database system 128 may be a database application, typically implemented as a web service. The analytics database system 128 stores all user interactions, e.g., user selections or "hits", searches, dates, types of mobile device, and/or movement patterns represented as heat maps, in real time, and generates analytics relating to the user interactions. Advantageously, because user interactions are recorded for several different the devices 108, 114, 116, 118, and 122, a relatively large sample size is obtained. The large sample size may allow analytics engine 132 to plot heat maps that are useful for users and to provide suggestions to improve user experience.

The GIS 124 is, typically, a representational state transfer (REST)-ful application programming interface (API). The GIS 124 includes routing algorithms 134, electronic facility maps 136, associated facility metadata 138, jurisdiction maps 142, and annotations 144. The GIS 124 may store the electronic facility maps 136, the facility metadata 138, jurisdiction maps 142, and annotations 144, handle updates to the electronic facility maps 136, facility metadata 138, jurisdiction maps 142, and annotations 144 and provide the electronic facility maps 136, the facility metadata 138, and the annotations 144 to the devices 108, 114, 116, 118, and 122. Typically, the GIS 124 serves the electronic facility maps 136, e.g., as PNG files, and the facility metadata 138, e.g., as JSON/XML files, over the web. The facility metadata 138 is customizable for the type of facility, and may include digital representations of paths, polygons encapsulating facility units, nodes corresponding to facility locations, identifiers for each facility unit, and qualitative metadata, such as the type of path, e.g., hallway or dirt trail. Optionally, information about the objects utilized for a given system (i.e. all of the objects that are used to define a given facility, etc.) can be stored in the server platform in an object library that can be a separate module on the server platform 112, or may be incorporated within the electronic facility maps 136 module, facility metadata module 138 or any other suitable location.

The GIS 124 also uses the routing algorithms 134 to calculate routes and provides the routes to the devices 108, 114, 116, 118, and 122. Typically, the routing calculations output a JSON/XML list of node or polygon identifiers representing a complete path, which the devices 108, 114, 116, 118, and 122 will interpret and display. The output may also include points of interest and other metadata 138, such as total estimated travel time based on type of path and real-time traffic, as described herein.

The visitor devices 122 may be efficiently managed and run both online and offline. The visitor devices 122 may create a simple navigation tool that engages visitors as they seek out more information about the venue. Each interface may be carefully designed with a focus on the user experience. Designs can be adapted to each venue's brand and specific needs, providing a unique interface with no disruption to the user experience. The visitor devices 122 may be configured to provide a smooth, intelligent personal indoor navigation experience. Visitors can access directions and venue information from anywhere in the venue. Alternatively or additionally, visitors can plan routes prior to arriving and contact a location by phone or via social media directly from their personalized profile.

The server platform 112 may include a portal management module 140 for managing the wayfinding system 100. As shown in FIG. 2, the portal management module 140 is a module within the CMS 126. In other embodiments, the portal management module 140 may be external to the CMS 126. The emergency service provider device 108, the store device 114, the facility device 116, and the administrator device 118 can communicate with the portal management module 140 to create and modify facility related data.

With portal management module 140 as shown in FIG. 2, all building data may optionally be generated or modified using one tool via, for example, a web browser.

The portal management module 140 may include collaborative tools with secure user accounts and permissions. In some embodiments, each user may be assigned a role with appropriate security credentials, such as an emergency service provider (emergency service provider device 108), an administrator (administrator device 118), a facility manager (facility device 116), and a store manager (store device 114). The portal management module 140 can provision devices 108, 114, 116, and 118 and user accounts, and associate the devices 108, 114, 116, 118 to the user accounts.

As noted above, the portal management module 140 may be separated into further components. For example, a first portal management module (not shown) can manage the creation and modification of the electronic facility maps 136, a second portal management module (not shown) can manage the annotations 144, and a third portal management module (not shown) can manage facility metadata 138.

The portal management module 140 can enforce various rules for devices and user accounts, if desired. For example, the administrator device 118 may have higher security clearance in terms of accessing and updating data, and modifying settings. The facility device 116 may be configured to change venue and store descriptions, logos and so on, but may not have permission to alter electronic facility maps 136, etc. The store device 114 may be configured to modify or alter data relating to the store/tenant account that it is associated with, but may not have permission to alter electronic facility maps 136, etc. The emergency service provider device 108 may be configured to have permission to annotate electronic facility maps 136, namely to annotate electronic facility maps 136 with service resources related to their emergency service, but may not have permission to alter electronic facility maps 136. The annotation 144 can include an icon to graphically represent a position of the service resource within the facility.

As a further example, a venue editor may log into portal 140 make edits to an electronic facility map 136 and save the electronic facility map 136 at different stages. The unfinished electronic facility map 136 may be saved in draft mode, where the venue editor may not have permission to publish the updated electronic facility maps 136 until approved by administrator or facility owner from the administrator device 118 or the facility device 116, and the wayfinding system 100 may be configured to track approvals.

To help enable system users to create navigable electronic maps 136 for a facility (including the plurality of facility units and other objects within a given facility) and the facility metadata 138, in a useful and correct manner, the wayfinding system 100 may provide one or more map creation tools or frameworks. The map creation tools may be part of the wayfinding system 100, and may be accessed, for example, via the portal management module 140 or in any other suitable way. For example, if not part of the portal management module 140 of the wayfinding system 100, and/or the server platform 112 may include a separate map creation module. The map creation tool may preferably be configured to help users, with little to no design and/or programming experience, to create navigable electronic maps 136, including facility metadata 138, facility units, obstructions, connections, regions, and the like, that can be used in the operation of the wayfinding system 100. The map creation tool may have any suitable configuration that can help guide and/or assist system users in creating their desired data in a useful manner, while still being relatively easy to use and allowing a system user a relatively high degree of autonomy and design freedom with respect to the navigable electronic maps 136 and facility metadata 138 (as well as any other applicable portions of the wayfinding system 100 and server platform 112, such as the routing algorithms 134, etc.).

The map creation tool can help ensure that navigable electronic maps 136 are created in an organized manner and/or in accordance with a set of prescribed practices to ensure that the resulting data is consistent, is compatible with existing data, and in particular is valuable such that it can be used for mapping and wayfinding functions. For example, navigable electronic maps 136 containing a facility unit (such as a store in a retail facility map) should be assigned an appropriate attribute or geometric data for the wayfinding system 100 to properly identify and navigate with respect to the facility unit. As an example, a given facility unit may fail to include properly identifiable doors, doorways, or other access points, or may be improperly positioned within the navigable electronic maps 136 such that a gap between adjacent facility units may appear to be a traversable passage to the wayfinding system 100, when in fact no such passage exists in the real world.

Similar problems may be created if obstructions, connections, regions and/or other objects within the facility and/or a given facility unit are not properly created, defined and connected with each other in the navigable electronic maps 136. These data-quality related issues may lead to errors or sub-optimal performance of the wayfinding system 100 and/or may result in an unwanted visual appearance of the facility units and/or obstructions if a given electronic map is rendered in two-dimensions (2D) or three-dimensions (3D) or otherwise visually presented to a user (e.g. walls may appear misaligned, store shelves may appear to be floating or interfering with other objects, etc.).

Figure 3:
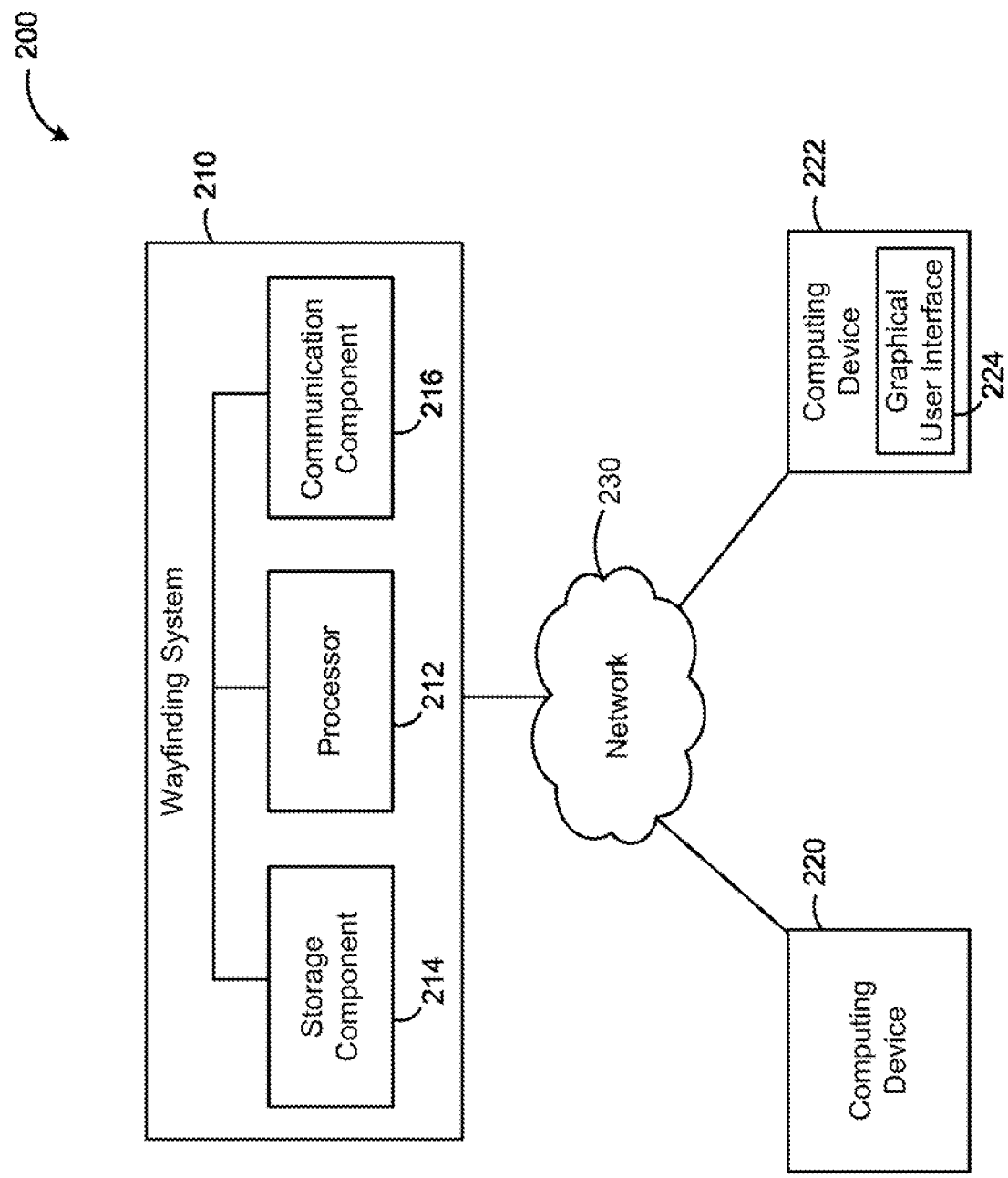
FIG. 3 is a block diagram of a wayfinding system, in accordance with at least one embodiment.

FIG. 3 shows a block diagram 200 of an example wayfinding system 210 providing a map creation tool in communication with computing devices 220, 222 via a network 230. Computing devices 220, 222 may be associated with administrator accounts. Although two computing devices 220, 222 are shown in FIG. 1, the wayfinding system 210 can be in communication with fewer or more computing devices 220, 222. The wayfinding system 210 can communicate with the computing devices 220, 222 over a wide geographic area via the network 230.

As shown in FIG. 3, the wayfinding system 210 includes a processor 212, a storage component 214, and a communication component 216. The wayfinding system 210 may include one or more servers that may be distributed over a wide geographic area and connected via the network 230. In some embodiments, each of the processor 212, the storage component 214 and the communication component 216 may be combined into a fewer number of components or may be separated into further components.

The processor 212 may be any suitable processors, controllers, digital signal processors, graphics processing units, application specific integrated circuits (ASICs), and/or field programmable gate arrays (FPGAs) that can provide sufficient processing power depending on the configuration, purposes and requirements of the wayfinding system 210. In some embodiments, the processor 212 can include more than one processor with each processor being configured to perform different dedicated tasks.

The processor 212 may be configured to control the operation of the wayfinding system 210. The processor 212 can include modules that initiate and manage the operations of the wayfinding system 210. The processor 212 may also determine, based on received data, stored data, and/or user preferences, how the wayfinding system 210 may generally operate.

The communication component 216 may be any interface that enables the wayfinding system 210 to communicate with other devices and systems. In some embodiments, the communication component 216 can include at least one of a serial port, a parallel port or a USB port. The communication component 216 may also include at least one of an Internet, Local Area Network (LAN), Ethernet, Firewire, modem, fiber, or digital subscriber line connection. Various combinations of these elements may be incorporated within the communication component 216.

For example, the communication component 216 may receive input from various input devices, such as a mouse, a keyboard, a touch screen, a thumbwheel, a track-pad, a track-ball, a card-reader, voice recognition software and the like depending on the requirements and implementation of the wayfinding system 210.

The storage component 214 can include RAM, ROM, one or more hard drives, one or more flash drives or some other suitable data storage elements such as disk drives, etc. The storage component 214 is used to store an operating system and programs, for example. For instance, the operating system provides various basic operational processes for the processor 212. The programs include various user programs so that a user can interact with the processor 212 to perform various functions such as, but not limited to, viewing and/or manipulating the electronic facility maps 136 and annotations 144, as well as retrieving and/or transmitting position data of the computing device 220, 222 as the case may be.

The storage component 214 may include one or more databases (not shown). The storage component 214 stores the navigable electronic maps 136. In some embodiments, the storage component 214 can store CAD source files or satellite imagery used as a basis for the creation of electronic facility maps 136 by the map creation tool. In some embodiments, the storage component 214 can store site configuration files for each facility represented in the navigable electronic maps 136. In some embodiments, the storage component 214 can store wayfinding data including routing algorithms 134, facility metadata 138 including information related to the facilities, owners, property management, and tenants, and metadata including information related to computing devices 220, 222.

Electronic facility maps 136 described herein can include any two-dimensional or three-dimensional representation of the facility. The electronic facility maps 136 can have any size and resolution and can contain objects that comply with any appropriate standard. In some embodiments, the objects of the electronic facility maps 136 can be adjusted in one or more pre-processing stages.

The computing devices 220, 222 may be any networked device operable to connect to the network 230. A networked device is a device capable of communicating with other devices through a network such as the networks 120, 230. A network device may couple to the network 230 through a wired or wireless connection.

The computing devices 220, 222 may include at least a processor and memory, and may be an electronic tablet device, a personal computer, workstation, server, portable computer, mobile device, personal digital assistant, laptop, smart phone, WAP phone, an interactive television, video display terminals, gaming consoles, and portable electronic devices or any combination of these.

In some embodiments, the computing devices 220, 222 may be a laptop, a smartphone device, or a wearable device (e.g., a smart watch, smart glasses) equipped with a network adapter for connecting to the Internet. In some embodiments, the connection request initiated from the computing devices 220, 222 may be initiated from a web browser and directed at the browser-based communications application on the wayfinding system 210. The computing device 222 may include a graphical user interface (GUI) 224. GUI 225 can be integral or separate from computing device 222. Although only computing device 222 is shown in FIG. 1 as having a GUI 224, more computing devices 220 can include a GUI 225.

The network 230 may be any network capable of carrying data, including the Internet, Ethernet, plain old telephone service (POTS) line, public switch telephone network (PSTN), integrated services digital network (ISDN), digital subscriber line (DSL), coaxial cable, fiber optics, satellite, mobile, wireless (e.g. Wi-Fi, WiMAX), SS7 signaling network, fixed line, local area network, wide area network, and others, including any combination of these, capable of interfacing with, and enabling communication between, the wayfinding system 210 and the computing device 220, 222.

The network 230 can include components located within the facility such as beacons and Wi-Fi interface components from which a computing device 220, 222 located within the facility can determine its position.

As noted above, the wayfinding system 210 of FIG. 3 can be include one or more servers that may be distributed over a wide geographic area and connected via the network 230 and each of the processor 212, the storage component 214 and the communication component 216 can be separated into further components.

Figure 4:
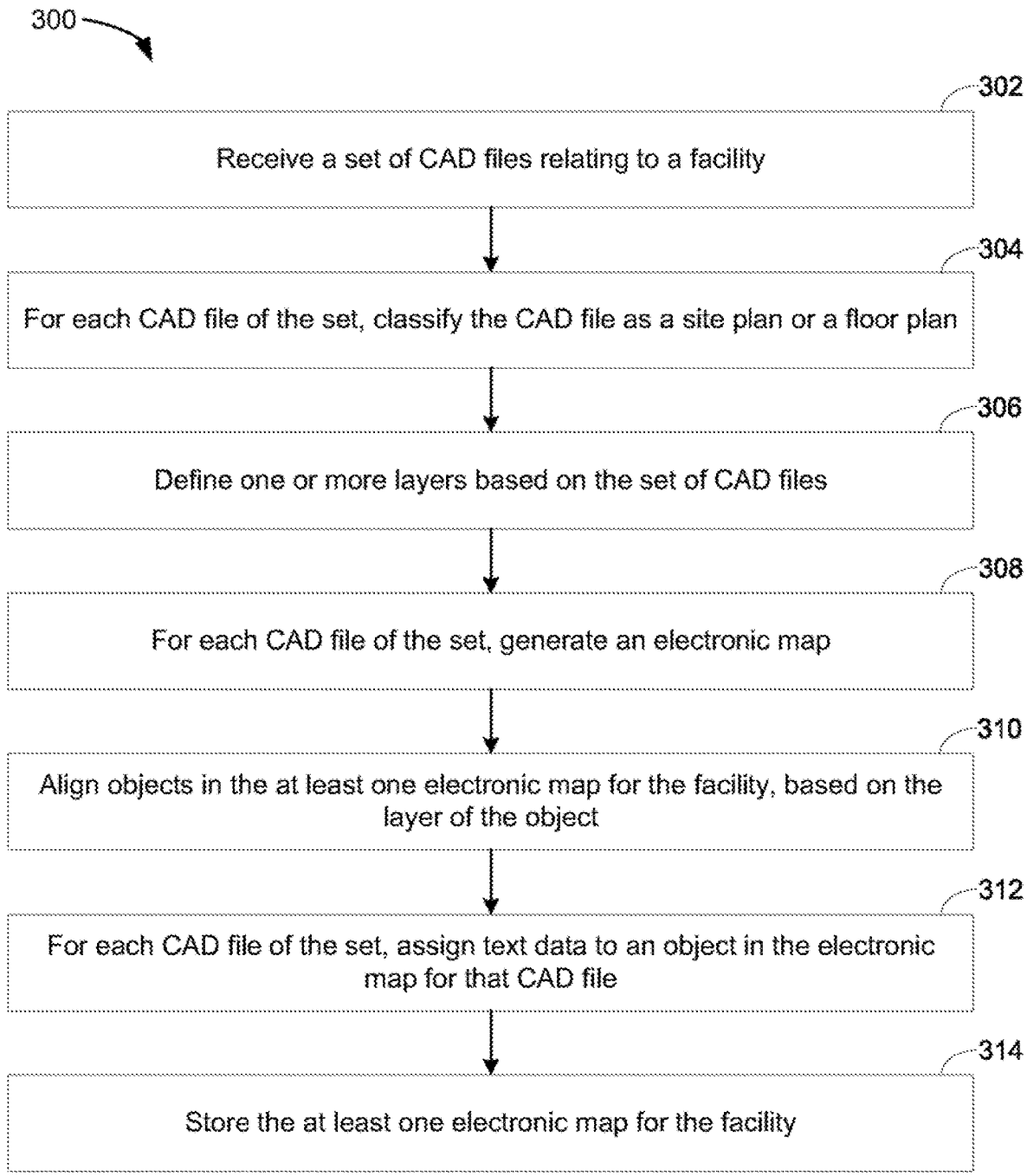
FIG. 4 shows a flow chart of methods for creating electronic maps for a facility from a set of CAD files relating to the facility, in accordance with at least one embodiment.

With reference now to FIG. 4, there is shown a flow chart of a method 300 for creating an electronic map from a set of computer-aided-design (CAD) files. The method 300 may be implemented by a processor of the administrator devices 118, facility devices 116, store devices 114, or server platform 112 of the wayfinding system 100 of FIG. 1.

The method 300 can begin at 302 when the processor receives a set of CAD files relating to a facility. The facility can be represented by at least one CAD file. That is, the set of CAD files can include one or more CAD files. The set of CAD files include at least one floor plan. In some embodiments, the set of CAD source files also include a site plan.

At 304, the processor classifies each CAD source file as being a site plan or one or more floor plans. A site plan generally includes external structural components such as exterior walls and doors, and curbs and walkways. Some site plans also include parking, nearby roads, and landscaping elements. In contrast, a floor plan of the facility generally includes internal structural components, such as columns, walls, doors, elevators, stairs, escalators, and relevant exterior walls. Some floor plans also include washrooms and interior structural features.

In some embodiments, 304 involves the processor receiving user input from at least one input device that indicates whether a CAD file relates to a site or one or more floors of the site. In such embodiments, the processor can display, on at least one output device, the CAD file to be classified. Displaying the CAD file to be classified can involve displaying the CAD file name and/or displaying a rendering of the CAD file.

In some embodiments, the at least one CAD file does not include a site plan. In such embodiments, a CAD file for an interior floor plan of the facility can be used as the site plan by extending boundaries of the floor plan to allow for proper alignment of other floors, which may be larger. Optionally, the CAD file of the first interior floor plan can be used as the site plan. It can be assumed that diagrams in different CAD files for the same facility are drawn to the same scale. To extend boundaries of the floor plan to be used as the site plan, a maximum diagonal size of boundaries amongst all the CAD files can be determined to provide a suitably sized rectangular image canvas. The boundaries of the floor plan to be used as the site plan are then extended to be greater than the maximum diagonal size in both directions to allow for proper alignment of other floors.

In some embodiments, 304 involves the processor receiving user input from the at least one input device that indicates a latitude and longitude of a facility. In response to receiving the latitude and longitude of the facility, the processor can retrieve satellite imagery of a general area around and including the facility. The processor can segment one or more building exterior boundaries from the retrieved satellite imagery. The processor can align the building exterior boundary of the at least one CAD file with each of the one or more building exterior boundaries from the retrieved satellite imagery in order to identify the building exterior boundary from the retrieved satellite imagery that corresponds to the facility of interest and to be used as the site plan. The building exterior boundary from the retrieved satellite imagery that most closely aligns with the building exterior boundary of a floor plan in set of CAD files can be identified as the facility of interest. In some embodiments, the processor can require that the alignment satisfy some pre-determined threshold in order to determine a match.

When the processor classifies a CAD file as a floor plan, the processor also determines the specific floor of the facility that the floor plan relates to. That is, a single floor plan can relate to two or more floors of the facility. Optionally, two or more CAD files can relate to the same floor. For example, a first CAD file can relate to a first interior floor of the facility and a second CAD file can relate to an exterior pavilion of the facility.

At 306, the processor defines one or more layers based on the set of CAD source files.

At 308, the processor generates an electronic map for each CAD file. The electronic map includes an internal representation of the CAD source file to allow for rendering of individual layers contents and the selection of layers to be included in the initial imagery (base map). The base map is used as a basis for the construction of the electronic map for each floor or site.

At 310, the processor aligns objects in the at least one electronic map for the facility, based on the layer of the object.

At 312, the processor assigns text data in the CAD source files to objects in the electronic map.

At 314, the processor stores the at least one electronic map for the facility in the storage component.

In some embodiments, the file classification determined in 304 and the layer definition generated in 306 can be defined in a site configuration file. That is, the processor can generate a site configuration file for the facility that includes a mapping for each CAD file of the set of CAD files and a definition of layers for the set of CAD files.

Figure 5:
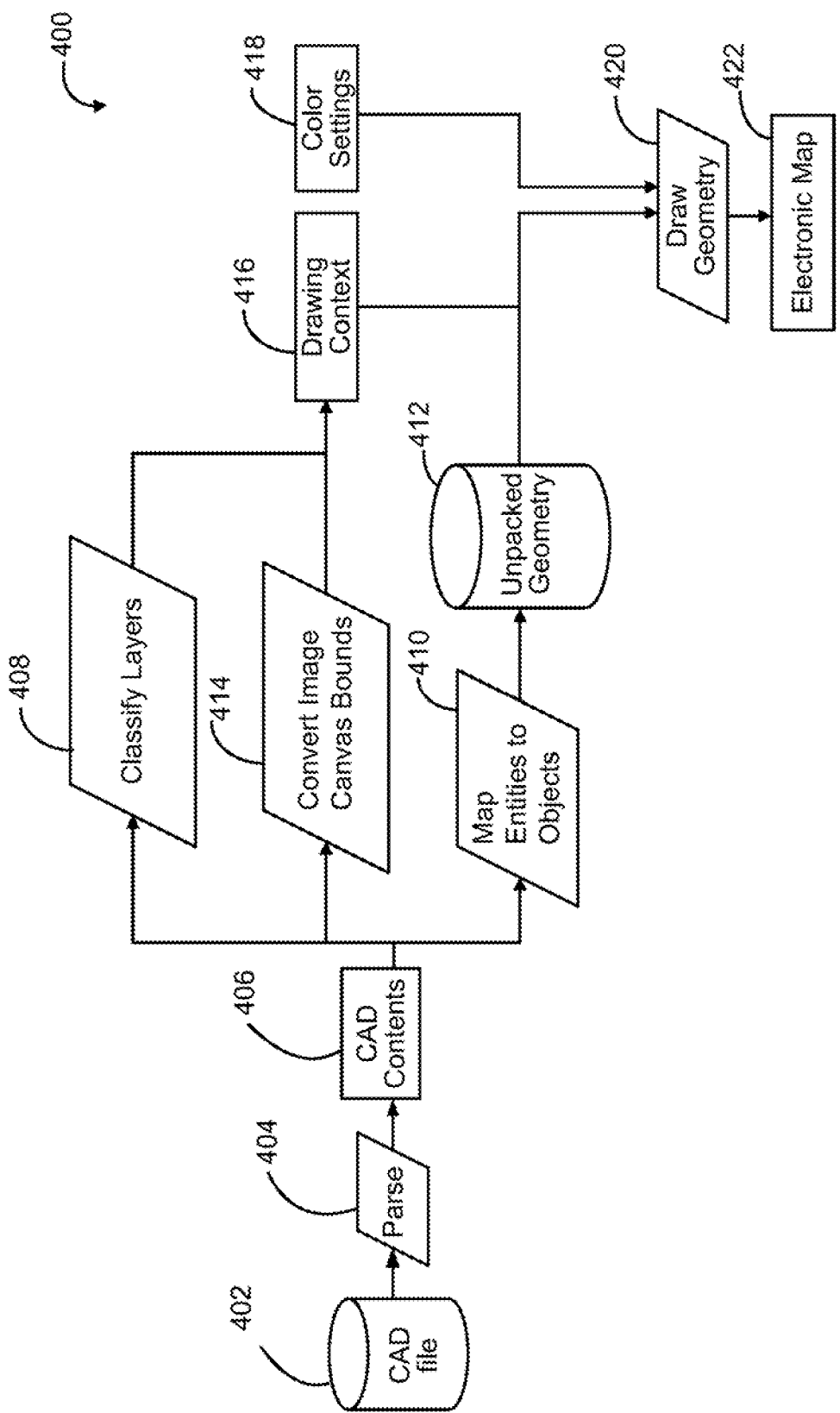
FIG. 5 shows a flow chart of methods for generating an electronic map from a CAD file, in accordance with at least one embodiment.

With reference now to FIG. 5, there is shown a flow chart of a method 400 for generating an electronic map from a CAD file of a floor plan or a site plan. The method 400 may be implemented by a processor of the administrator devices 118, facility devices 116, store devices 114, or server platform 112 of the wayfinding system 100 of FIG. 1.

The method 400 begins with a CAD source file 402. At 404, a CAD parser can be used to convert the CAD source file 402 from a graphic image file format (e.g., ascii DXF format, dwg format, or portable document file (PDF) format) to a structured data representation, that is, CAD contents 406. In some embodiments, the method can include converting a first graphic image file format to a second graphic image file format (e.g., dwg format to DXF format) to allow for operability of the CAD source file 402 and other software without requiring a specification for the CAD source file 402.

CAD source files 402 are created by a draftsperson. A CAD source file 402 generally includes a header section, a tables section, and a collection of entities. The header section typically defines document wide configurations. The table section typically defines layers, views, and pages contained in the CAD source file 402. Entities are generally constituent elements that compose the visible diagram contents. For example, entities can include discrete elements and block insertions. Discrete elements are generally singular components, such as a line, a polyline, a circle, an arc, an ellipse, or a text string. Block insertions relate to a collection of entities to be inserted at one or more locations. Furthermore, entities in a block insertion can include nested block insertions.

To define layers, the tables section includes a layer configuration table containing layer descriptions and aspects (e.g., a default color and line style for elements of a given layer), and layer configuration details (e.g., whether a layer is visible and/or frozen). When creating the CAD source file 402, the draftsperson may flag one or more layers as being visible when the one or more layers contain collections of elements (e.g., exterior walls) that the draftsperson wishes to be visible. In contrast, other layers can be flagged as being non-visible when they contain collections of elements that are not relevant to general viewing, such as grid lines, historical records, a previous layout, a division of an interior space, a proposed or potential layout, or other information such as 'no build' regions or financial data (e.g., rent valuations). Frozen layers generally refer to layers that are do not require further modification, particularly while other layers are being drawn or edited. Frozen layers are typically non-visible.

At 408, the processor can classify layers defined in the layer configuration table of the CAD contents 406 to obtain a list of layer visibilities for the electronic map 422. More specifically, the processor can, for each layer defined in the layer configuration table, classify that layer as being visible (e.g., drawn in the electronic map 422) or non-visible (not drawn in the electronic map 422). Thus, the list of layer visibilities identifies the layers of the CAD source file 402 that should be drawn in the electronic map 422.

In some embodiments, a pre-determined set of rules can be used to extract the list of layer visibilities. For example, the processor can include any layer that is visible and/or not frozen in the CAD source file 402 as being in the list of layer visibilities. In some embodiments, the processor can include layers in the list of layer visibilities based on a naming convention of the layer and/or the collections of elements included in the layer.

In some embodiments, a user can further inspect the list of layer visibilities generated by the processor and make manual modifications to the list of layer visibilities. For example, a layer in the CAD source file 402 may have been inadvertently left as visible. If included in the electronic map 422, such layers may add visual clutter to the electronic map 422 and reduce the legibility and utility of the electronic map 422. Upon inspection, the user can identify layers that should be included or not included in the electronic map 422, and edit the list of layer visibilities to add or remove layers from the list of layer visibilities.

At 410, the processor can map entities of the CAD contents 406 (i.e., CAD entities) to objects in the electronic map 422. That is, objects in the electronic map 422 provide the internal representation of the CAD file (e.g., unpacked geometry 412).

Figure 6:
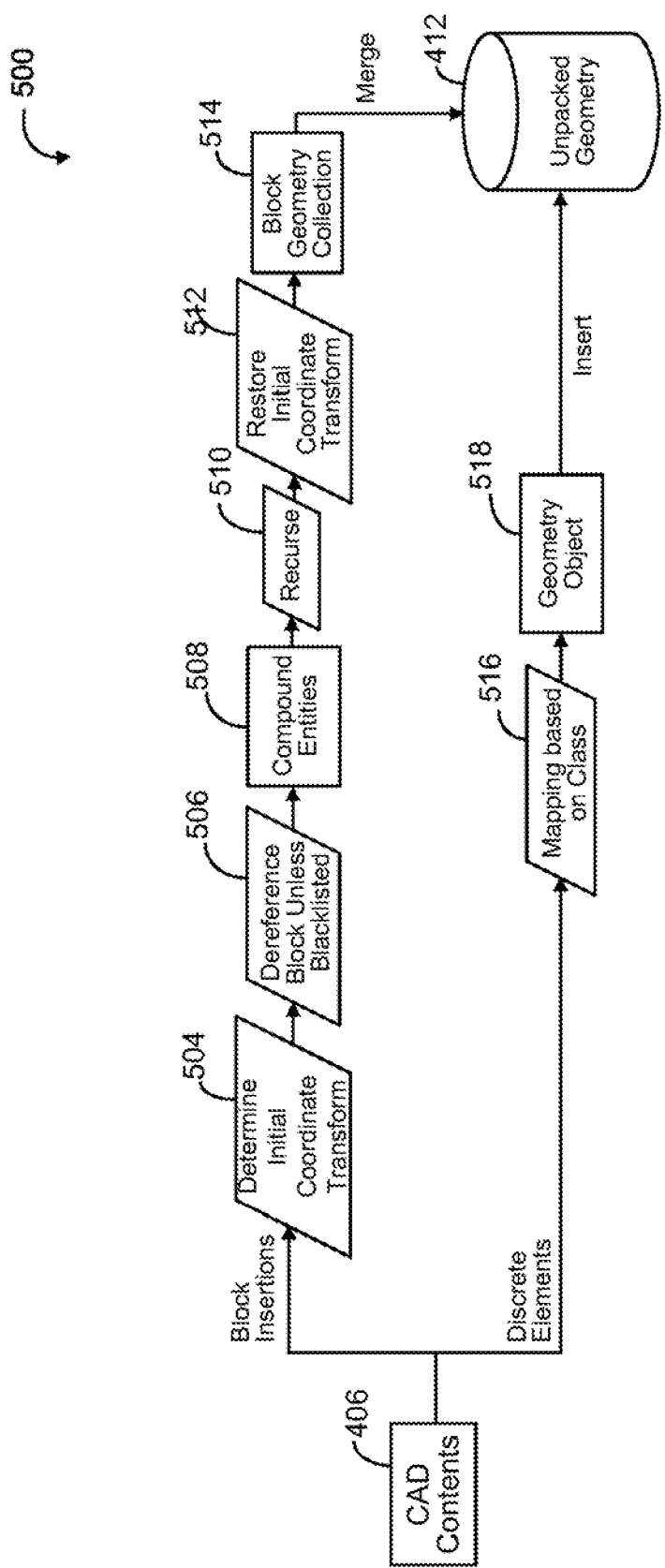
FIG. 6 shows a flow chart of methods for mapping CAD entities to objects in an electronic map, in accordance with at least one embodiment.

Referring now to FIG. 6, shown therein is a flow chart of a method 500 for mapping CAD entities to objects in the electronic map, thereby generating an internal data representation of the CAD file. The method 500 may be implemented by a processor of the administrator devices 118, facility devices 116, store devices 114, or server platform 112 of the wayfinding system 100 of FIG. 1.

As noted above, CAD entities can include discrete elements and block insertions. As shown in FIG. 6, block insertions and discrete elements can be mapped separately.

Generally, the process for mapping block insertions begins at 504 with the processor determining an initial coordinate transform matrix as the current coordinate transform matrix. In some embodiments, the processor can use a 4×4 identity matrix as the original coordinate transform matrix at 504.

At 506, the processor can dereference the block insertion, unless the block has been blacklisted. By deferencing blocks in block insertions, the processor can obtain compound entities 508, that is, the collection of entities contained in a block. Each block insertion is associated with one or more insertion point and one or more Insert Elements, that is, the Insertion Definition. To dereference the block insertion at 506, the processor applies a transformation to the current coordinate transform matrix based on the insertion points and Insert Elements identified for the block insertion. The Insert Element defines the rotation and scaling of block geometry to be placed in the diagram at a location in the Diagram Coordinate System with a set rotation and scale.

Figure 7A:
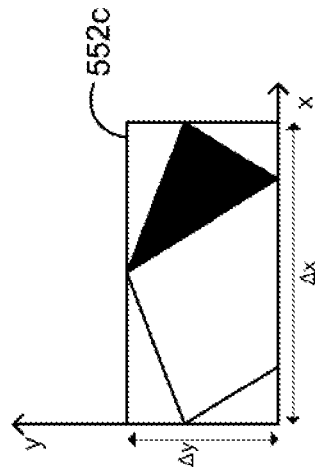
FIG. 7A to 7F illustrate transformations applied to a block insertion.
Figure 7D:
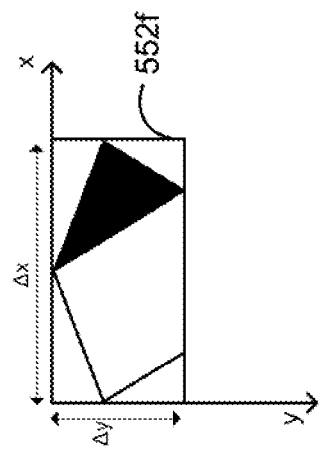
Figure 7B:
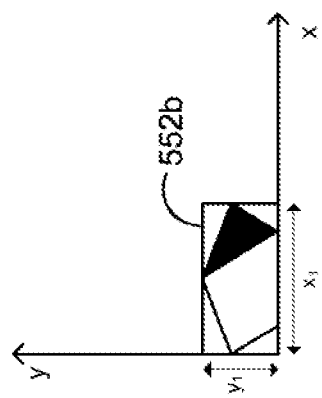
Figure 7E:
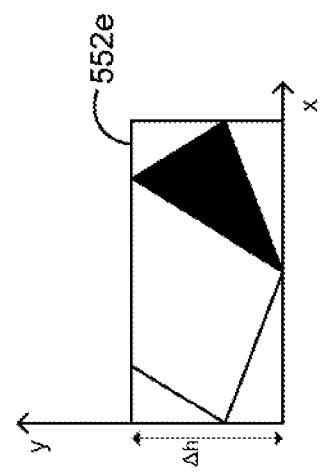
Figure 7C:
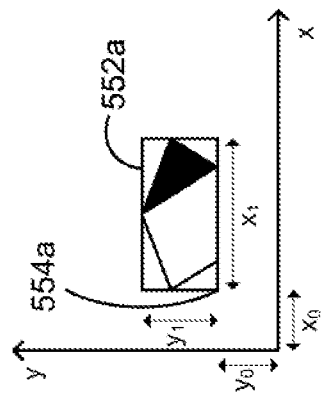

Reference will also be made to FIGS. 7A to 7C to illustrate the transformation applied to the block insertion. Each block insertion is stored in the CAD source file 402 with its own coordinate system (i.e., Object Coordinate System). As shown in FIG. 7A, a block insertion can include a component bounding box 552a having dimensions (x1, y1) at position (x0, y0). The bottom left corner 554a of the component bounding box 552a is anchored at origin (0, 0) of the Object Coordinate System. As shown in FIG. 7B, the block insertion can be inserted into a diagram having its own coordinate system (i.e., Diagram Coordinate System) and translated at the associated insertion point by (x0, $y_0$) as shown by the component bounding box 552b in FIG. 7B. FIG. 7C shows the block insertion being further rotated (e.g., by 0 degrees in FIG. 7C) and scaled, by a delta ($\Delta$) scaling factor defined by the associated Insert Element, resulting in the component bounding box 552c having dimensions ($\Delta$x, $\Delta$y). For example, the rotation and scale defined in an Insert Element can be 0 degrees (i.e., as shown in FIG. 7C) and 1.0 scale (i.e., $\Delta$ of FIG. 7C being 1.0), respectively. In order to properly locate the block insertion in the electronic map 422, the processor can generate a copy of the block insertion at the insertion point with the rotation and scaling as defined in the Insert Element.

Generally, the transformation is also reversible by a 4×4 inverse of the coordinate transform matrix, with the exception of degenerate scale factors such as 0 and $\infty$. Insert Elements having degenerate scale factors can be included in a blacklist maintained by the processor. The blacklist can also include blocks having malformed, degenerate, or malicious diagram files that, when deferenced, can infinitely cycle through nested block insertions. Block insertions can each have a unique block identifier. In some embodiments, the blacklist can be a list of the block identifiers.

As noted above, block insertions can include nested block insertions. That is, a block insertion can relate to another block insertion. Thus, the process for mapping block insertions to objects can be recursive, as indicated by 510.

Returning now to FIG. 6, for this recursive process 510, the processor can use a stack of coordinate transformation matrices 504 to reiterate through the block insertions until only diagram elements remain. Use of a stack of coordinate transform matrices can save time and potential accumulation of floating point precision errors. More specifically, the current coordinate transform matrix can be pushed to a stack and its product with an insert transform matrix can be made the current coordinate transform matrix until the inserted geometry is processed to obtain the block geometry. After the inserted geometry is processed, the most recent coordinate transform matrix pushed to the stack is popped off the stack. This process can continue until the initial coordinate transform is restored at 512. By pushing and popping coordinate transform matrices on and off a stack, the initial coordinate system can be quickly and accurately restored. By processing the inserted geometry of each block insertion, including nested block insertions, the processor obtains a collection of block geometry 514.

In some embodiments, instead of using a stack of coordinate transformation matrices, the current coordinate transform matrix can be multiplied with an inverse of the insert coordinate transform. However, this can result in floating precision errors and require more processing time.

In some embodiments, such as the insertion of a drawing into another diagram, instead of beginning with a 4×4 identity matrix, the initial coordinate transform matrix can reference the coordinate transform matrix of Insert Elements.

As noted above, discrete elements can be mapped separately from block insertions. At 516, discrete elements are handled on a class basis. Discrete element classes include, but are not limited to, lines, polylines (i.e., lightweight), arcs, circles, ellipses, solids, and text (i.e., multiline). At 516, discrete elements of each class can be converted, or mapped, to a geometry object 518, such as a new polyline or a text representation. The geometry objects 518 are inserted into the unpacked geometry 412.

At 412, the unpacked geometry is obtained by merging converted geometry elements, that is, geometry objects obtained from discrete elements and block geometry collections obtained from block insertions. The merge can be conducted on a hierarchical basis. That is, a layer name basis, followed by element classes. For example, an element of the class 'SOLID' on layer '0' would appear in a list with all other such elements in the unpacked geometry (e.g., ['0']['SOLID']). Preserving the layer hierarchy allows the processor to process objects, based on layer. For example, some CAD files are created with content in specific layers for some purpose. That purpose may be directly applicable to the electronic map.

Returning now to FIG. 5, an image canvas bounds is also extracted from the CAD contents 406 at 414 and used to initialize the drawing context 416 of the electronic map 422. Reference will also be made to FIGS. 7A to 7F to illustrate the initialization of the drawing context from the image canvas bounds.

Figure 7F:
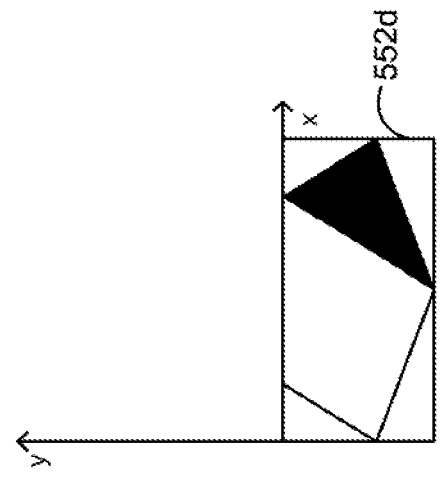

Diagram contents, that is CAD entities, can be arbitrarily located within the CAD model space. As shown in FIGS. 7A to 7E, the image canvas bounds of CAD entities is defined in the coordinate system of the CAD model space with an origin (0,0) in the bottom left, with x in a rightward direction from the origin, and y in a upward direction from the origin. However, as shown in FIG. 7F, the computer graphics coordinate system has an origin (0, 0) in the upper left with x in a rightward direction from the origin, and y in a downward direction from the origin.

To initialize the drawing context 416, the image canvas bounds is scaled by a scaling factor for the CAD model space to match the desired image size. In addition, the bottom left origin of the canvas bound is transformed to the top left origin in the desired computer graphics coordinate space. The processor performs the transformation from the coordinate system of CAD model space to the computer graphics coordinate system by inverting the y coordinates, as shown in FIGS. 7C and 7D. That is, the diagram content bounding box 552c of FIG. 7C is inverted to yield the diagram content bounding box 552d of FIG. 7D. The diagram content bounding box 552d of FIG. 7D is then translated downward by the image height ($\Delta$h) to yield the diagram content bounding box 552e of FIG. 7E. The diagram content bounding box 552e can be translated (not shown in FIG. 7F) and uniformly scaled along the x and y axes (shown as Δ in FIG. 7F) to fit onto an image canvas 552f with pre-determined maximum dimensions (Δx, Δy).

At 420, the processor draws geometry objects using the unpacked geometry 412 along with the drawing context 416 to provide electronic map 420. By default, geometry objects are drawn based on the colors in the CAD source file. The unpacked geometry stores objects containing functions so that elements on the layers classified as being visible are drawn onto the drawing context 416. Optionally, the geometry objects can be drawn with pre-defined color settings 418. Pre-defined color settings 418 can specify colors for each of the geometry objects. Pre-defined color settings 418 can be user-defined.

Figure 8:
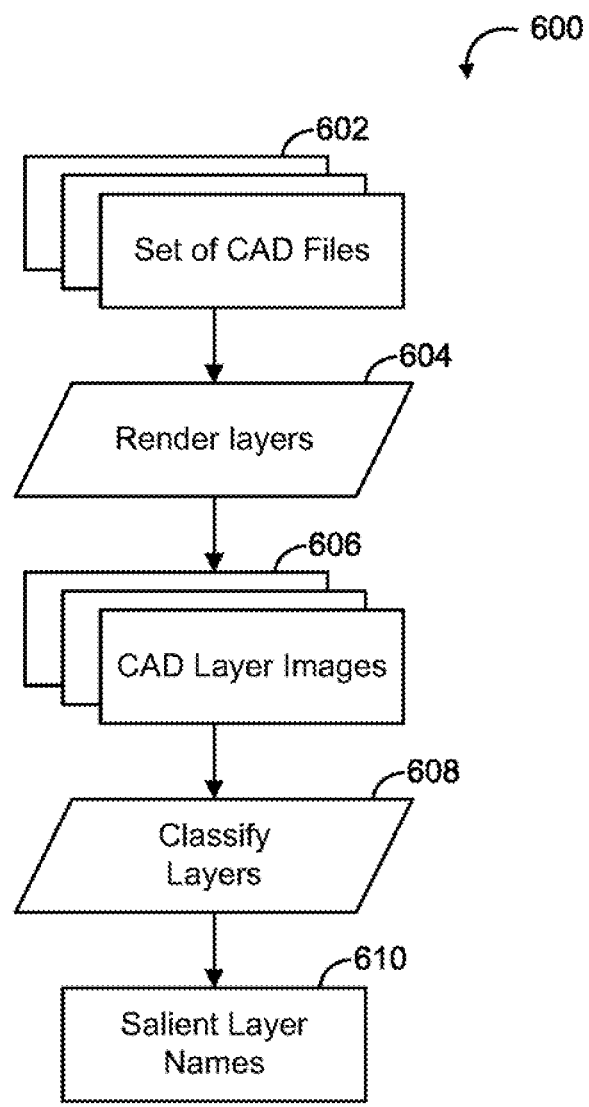
FIG. 8 shows a flow chart of methods for defining layers based on a set of CAD files, in accordance with at least one embodiment.

With reference now to FIG. 8, there is shown a flow chart of a method 600 for defining layers based on the set of CAD files. The method 600 may be implemented by a processor of the administrator devices 118, facility devices 116, store devices 114, or server platform 112 of the wayfinding system 100 of FIG. 1.

Method 600 begins at 602 with the processor receiving the set of CAD files relating to the facility, similar to 302 of FIG. 4. Each CAD file can include one or more layers. The layers defined for a CAD file can depend on the facility. For example, a floor transition layer may be defined for multi-storey facilities but not for single-storey facilities. In some embodiments, two or more CAD files can each have a same layer. For example, two or more CAD files can each have a structural column layer or a floor transition layer. In some embodiments, a layer can be defined for only one CAD file. For example, only one CAD file may have a road/walkway layer or a fire hydrants layer. In some embodiments, all contents of a CAD file can be stored in a single layer.

At 604, each layer of each CAD file is rendered to provide one or more CAD layer images 606. That is, an image of the contents, or CAD entities, of each layer of a CAD file is created. The contents of a layer can relate to any appropriate features. For example, a layer can relate to each one of the following features: exterior building boundaries/walls, structural columns, floor transitions (i.e., stairs, elevators, and/or escalators). Furthermore, in some embodiments, separate layers may be defined for each type of floor transition (i.e., a first layer for stairs, a second layer for elevators, and a third layer for escalators). A vision-based system can use the rendered images 606 to extract the CAD entities for classification.

At 608, the processor classifies the contents of the rendered images 606 as belonging to a layer to provide one or more salient layer names 610. For example, a particular shape can be associated with elevators and the processor can automatically detect that particular shape in the rendered images 606 as being elevators and classifying CAD entities having that particular shape as belonging to a floor transition layer.

In some embodiments, 608 involves the processor receiving user input from the at least one input device that indicates a layer for CAD entities of the CAD file. In some embodiments, the indication can generally relate to a confirmation of a classification performed by the processor. In some embodiments, the indication can relate to a change to the classification performed by the processor. For example, the shape of features can vary with architecture style. The processor may not recognize the shape of a CAD entity as being an elevator and the processor may assign that CAD entity to a "miscellaneous" or "unclassified" layer. Subsequently, the processor may receive user input indicating that the CAD entity belongs to a floor transitions layer and change the layer of that geometry object accordingly.

In some embodiments, the processor may not perform the classification of CAD entities based on shapes. By default, the processor may assign each of CAD entity to a "miscellaneous" or "unclassified" layer. The processor may receive user input from the at least one input device that indicates a layer for each of the one or more CAD entities of the CAD file.

In some embodiments, additional layers can be added at 608. The additional layers can relate to salient features, such as stores, kiosks, and washrooms. Salient features can include components that are desirable for an electronic map such as amenities, stores, elevators, and store identifiers. In contrast, other information, such as square footage or contents of utility rooms can be considered non-salient.

In some embodiments, salient features may be identified by text in the CAD file. Furthermore, the text can adopt a particular naming pattern. In some embodiments, the processor can classify text in the CAD file and rendered in the images 606 as salient features and define an appropriate salient layer for the salient feature.

Figure 9:
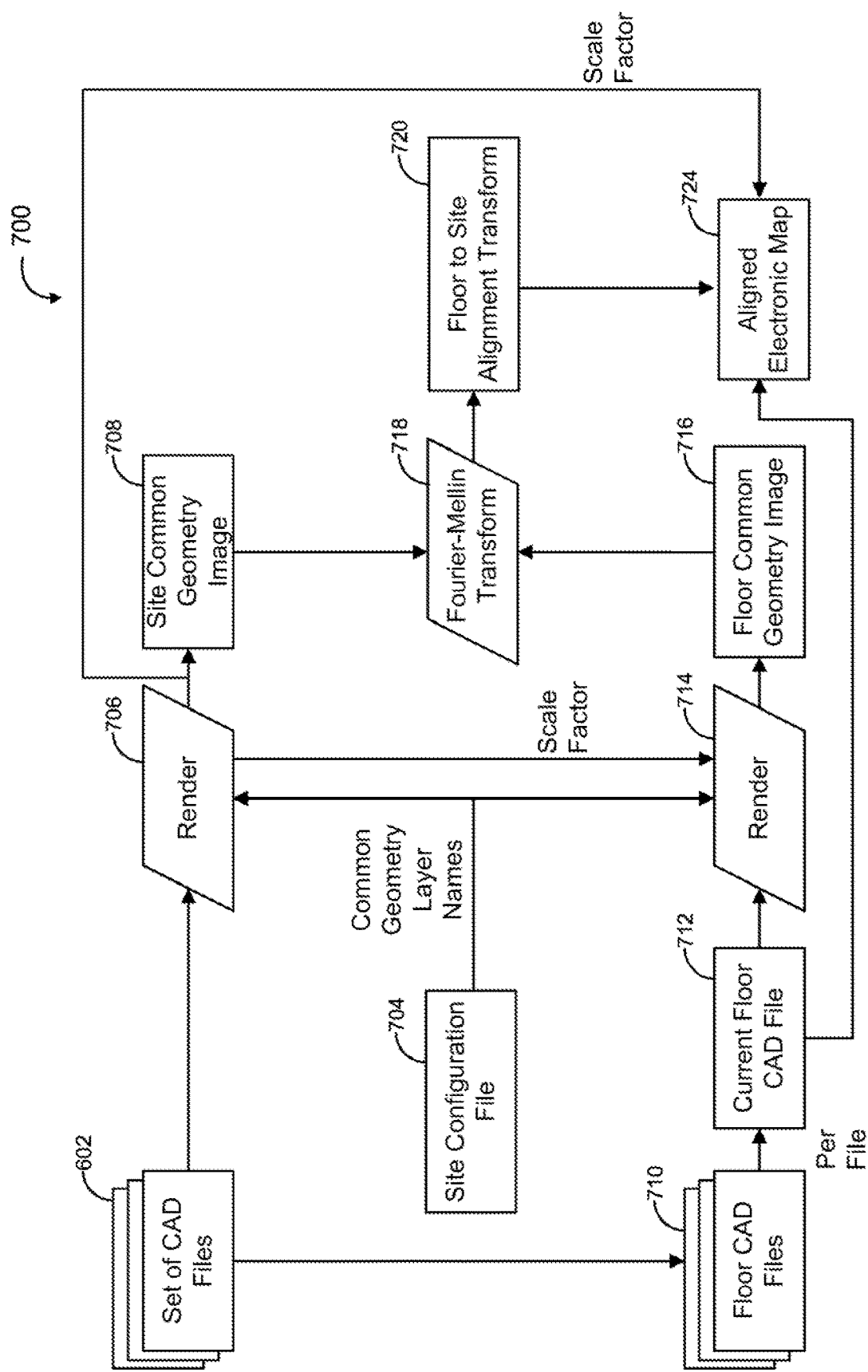
FIG. 9 shows a flow chart of methods for aligning objects in an electronic map for a facility, in accordance with at least one embodiment.

With reference now to FIG. 9, there is shown a flow chart of a method 700 for aligning objects in an electronic map for the facility. The method 600 may be implemented by a processor of the administrator devices 118, facility devices 116, store devices 114, or server platform 112 of the wayfinding system 100 of FIG. 1.

The method 700 can begin with a set of CAD files 602. The processor can extract the one or more CAD files that include a floor plan 710 from the set of CAD files 602. For each CAD file that includes a floor plan 712, the processor determines a transformation 720 that aligns objects in the floor plan with the site plan to provide an aligned electronic map 724 in which the objects of each floor are aligned. Each transformation 720 includes a combination of a rotation, a translation, and a scaling factor.

In order to align objects in the electronic map, the processor first identifies objects that are common to the site plan and one or more floors plans. The processor can identify such common objects based on layer names defined at 306. Optionally, the layer names are stored in a site configuration file 704.

In at least one embodiment, each CAD file of the set of CAD files uses a common scale between the internal CAD model space and real world measurements. In such cases, a single scaling factor can be used to draw, or render each CAD file to a raster image. That is, the same scaling factor (i.e., Δ) can be used to scale distances in the internal CAD model space to the computer graphics space (e.g., pixel distances). For example, 10 in the internal CAD model space may be equivalent to a centimeter.

At 706, the processor can render an image 708 of the site plan from the CAD file of the site plan. In the rendered site image 708, objects in the site plan that are common to one or more floor plans are drawn using a particular scaling factor (i.e., Δ).

At 714, the processor can render an image 716 of a floor plan from the CAD file of the floor plan. In the rendered floor image 716, objects in the floor plan that are common to the site plan are drawn using the same scaling factor (i.e., Δ). This process is reiterated for each floor plan.

Having drawn common geometry objects in multiple raster images 708, 716 using the same scaling factor (i.e., Δ), the alignment of the multiple raster images (e.g., floors with the site plan) becomes an image registration between the two common geometry images 708, 716. The processor can solve the image registration using a Fourier-Mellin transform 718 to find a polar spectrum decomposition. With the polar spectrum decomposition, the largest peak yields a rotation, location, and scaling factor that describes the best match of the floor image into the site plan image. The scaling factor generated by the Fourier-Mellin transform 718 is logarithmic. That is, the scaling factor is less accurate with larger scaling factors. Accordingly, a 1:1 scaling factor is assumed by using CAD files, each sharing a common scale between the internal CAD model space and real world measurements.

Combining the angular rotation (i.e., θ), the match location (i.e., x, y), and the scaling factor (i.e., Δ), the processor can define a transformation 720 (e.g., rotation, a translation, and a scaling) that maps the floor image onto the site plan image. That is, the processor translates a bottom left of the floor image to an origin of the site plan based on the translation from Fourier-Mellin, scales by the reciprocal of delta (i.e., 1/Δ), and applies the rotation. Given two raster images A and B, Fourier-Mellin provides the best match, location, and scale factor for finding image B in image A. The best match can be specified as (x, y, θ) in the coordinate system of the raster image A. In this process, raster image A is generated by translating and scaling the CAD contents so that the location of a point in the raster image A in the original CAD source file model space can be found by applying the inverse transform. This provides the location in the CAD model space that generated raster image A to place the CAD content that generated raster image B, under rotation θ.

Figure 10:
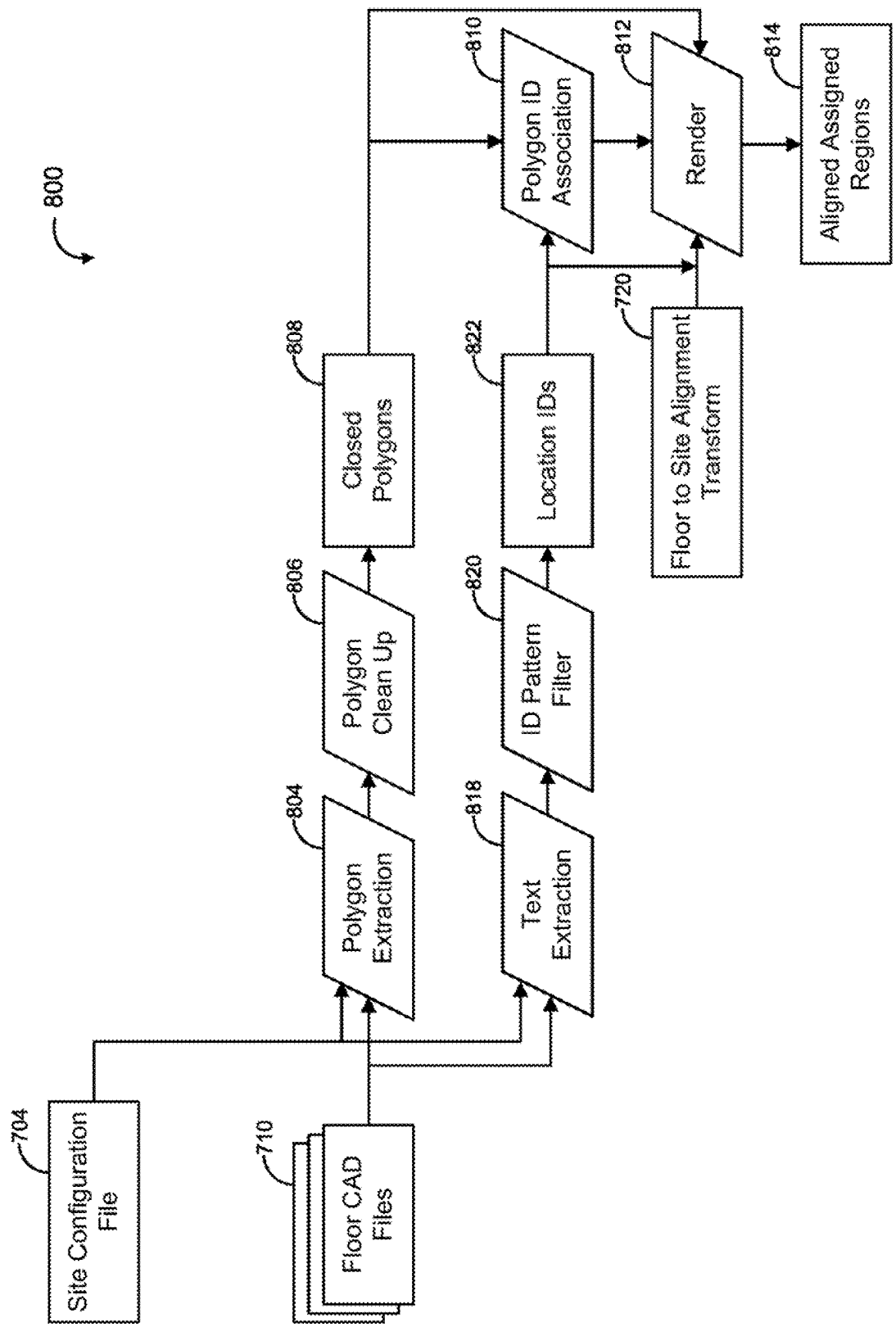
FIG. 10 shows a flow chart of methods for assigning text data to polygons within a CAD file of a floor plan, in accordance with at least one embodiment.

With reference now to FIG. 10, there is shown a flow chart of a method 800 for assigning text data to polygons within a CAD file of a floor plan. The method 800 may be implemented by a processor of the administrator devices 118, facility devices 116, store devices 114, or server platform 112 of the wayfinding system 100 of FIG. 1.

For each floor, the processor extracts closed polygons 804 from the CAD file. More specifically, the processor extracts closed polygons 804 from various layers of the CAD file. To determine which layers of the CAD file may contain closed polygons 804, the processor can refer to the layers names defined at 306. That is, layer names can be indicative of whether or not they may contain closed polygon 804 objects. In some embodiments, the processor can refer to the layer names are stored in the site configuration file 704.

In some embodiments, the processor can recognize substantially closed polygons as being closed polygons 808 and/or can clean up substantially closed polygons 806. Substantially closed polygons may be a result drawing errors in the CAD files and have open ends that were intended to connect. To clean up a substantially closed polygon, the processor can identify substantially closed polygons and connect the open ends together.

For each floor, the processor extracts text data 818 from the CAD file. More specifically, the processor extracts text data 818 from various layers of the CAD file. To determine which layers of the CAD file may contain text data 818, the processor can refer to the layers names defined at 306. That is, layer names can be indicative of whether or not they may contain text data 818. In some embodiments, the processor can refer to the layer names are stored in the site configuration file 704.

In some embodiments, the processor can detect patterns in the text 820 to determine location identifiers 822 contained in the text. Detecting patterns in the text 820 can include regular expression based filtering.

At 810, the processor can associate closed polygons 808 with location identifiers 822 by finding a bipartite matching between location identifiers with the closed polygons. That is, the processor can match location identifiers with closed polygons such that a maximum number of location identifiers are matched with closed polygons. Bipartite matching can be solved in a naïve manner by assigning a location identifier 822 to a polygon 808 with minimal distance or maximal overlap. Although, bipartite matching can result in multiple assignments, the assignments can be quickly corrected upon human review. That is, the processor can further receive user input confirming that the bipartite matching is correct.

Non-naive strategies for bipartite matching include proper maximal flow solutions. However, such strategies can result in a greater number of incorrect assignments. Furthermore, such incorrect assignments can be more difficult to correct. The naive strategy better matches the heuristics human drafters use when placing label text in CAD files.

At 812, the processor can render the closed polygons 808 and their associated location identifiers 822. Furthermore, the rendering 812 can use the transformation 720 that aligns objects in the floor plan with the site plan to provide an electronic map to ensure that the assigned regions are aligned 814 as well.

While the above description provides examples of one or more apparatus, methods, or systems, it will be appreciated that other apparatus, methods, or systems may be within the scope of the claims as interpreted by one of skill in the art.

The invention claimed is:

1. A system for creating an electronic map for a facility from computer-assisted-design (CAD) files, the system comprising:
   at least one data storage memory for storing at least one electronic map for the facility, the at least one electronic map including one or more layers, each layer including at least one object;
   communication component to transmit data including a set of CAD files relating to the facility and the at least one electronic map for the facility via a communication network; and
   a processor operatively coupled to the at least one data storage memory and the communication component, the processor being configured for:
      receiving the set of CAD files relating to the facility;
      for each CAD file of the set, classifying the CAD file as a site plan or a floor plan;
      defining the one or more layers based on the set of CAD files;
      for each CAD file of the set, generating an electronic map;
      aligning objects in the at least one electronic map for the facility, based on the layer of the object by:
         identifying common geometry objects that are common to the site plan and one or more floor plans;
         rendering an image of the site plan using a first scaling factor to draw the common geometry objects; and
         for each floor plan:
            rendering an image of the floor plan using the first scaling factor to draw the common geometry objects;
            determining a transformation that aligns the image of the floor plan with the image of the site plan; and applying the transformation to each common geometry object of the floor plan in the electronic map;

for each CAD file of the set, assigning text data in that CAD file to an object in the electronic map for that CAD file; and storing, on the at least one data storage memory, the at least one electronic map for the facility.

2. The system of claim 1, wherein the processor being configured for generating an electronic map further comprises the processor being configured for:

extracting one or more CAD content from the CAD file, the one or more CAD content comprising at least one layer and at least one entity;

for each of the at least one layer, classifying the layer as being visible or non-visible for the electronic map;

determining a drawing context for the electronic map from the one or more CAD content;

generating an internal data representation of the CAD file by mapping each of the at least one entity to an object in the electronic map; and drawing geometry based on the internal data representation of the CAD file and the drawing context to provide the electronic map.

3. The system of claim 2, wherein the processor being configured for drawing geometry based on the internal data representation of the CAD file and the drawing context to provide the electronic map further comprises the processor being configured for drawing geometry based on pre-defined color settings.

4. The system of claim 2, wherein:

each of the at least one entity consists of a discrete element or a block insertion; and the processor being configured for generating an internal data representation of the CAD file comprises the processor being configured for:

mapping block insertions to block geometry collections; and mapping discrete elements to geometry objects, based on a class of the discrete element.

5. The system of claim 1, wherein the processor being configured for classifying the CAD file comprises the processor being configured for:

receiving a latitude and longitude of the facility;

retrieving satellite imagery of the latitude and longitude of the facility; and segmenting the facility from the retrieved satellite imagery to use as the site plan;

wherein the processor being configured for segmenting the facility from the retrieved satellite imagery comprises the processor being configured for:

segmenting one or more buildings from the retrieved satellite imagery;

aligning each of the one or more segmented buildings to a floor of a CAD file in the set; and identifying the segmented building having a smallest alignment difference as the facility.

6. The system of claim 5, wherein the processor being configured for identifying the segmented building having a smallest alignment difference as the facility further comprises the processor being configured for:

comparing the alignment difference with a pre-determined alignment threshold; and only identifying the segmented building as the facility if the alignment difference is less than the pre-determined alignment threshold.

7. The system of claim 1, wherein the processor being configured for defining the one or more layers based on the set of CAD files further comprises the processor being configured for defining a layer based on one or more entities detected in the CAD file, the one or more shapes representing one or more physical features of the facility.

8. The system of claim 1, wherein the processor being configured for defining the one or more layers based on the set of CAD files further comprises the processor being configured for defining a salient layer based on text detected in the CAD file and associated with a region within the CAD file.

9. The system of claim 1, wherein the processor being configured for classifying the CAD file and defining the one or more layers based on the set of CAD files comprises the processor being configured for generating a site configuration file, the site configuration file storing the classification of files and the definition of one or more layers.

10. The system of claim 1, wherein the processor being further configured for determining a transformation that aligns the image of the floor plan with the image of the site plan comprises the processor being configured for:

using a Fourier-Mellin transform to generate a polar spectrum decomposition;

locating a largest peak in the polar spectrum decomposition; and using a rotation, location, and scaling factor at the largest peak as the transformation that aligns the image of the floor plan with the image of the site plan.

11. The system of claim 1, wherein the processor being further configured for assigning text data in that CAD file to an object in the electronic map for that CAD file comprises the processor being configured for:

extracting one or more closed polygons from the floor plan;

extracting one or more text strings from the floor plan, each text string comprising a location identifier; and associating each of the one or more location identifiers with a polygon of the one or more polygons.

12. The system of claim 11, wherein the processor being further configured for associating each of the one or more location identifiers with a closed polygon of the one or more closed polygons comprises the processor being configured for assigning each location identifier to a polygon with at least one of minimal distance and maximal overlap.

13. A computer-implemented method for creating electronic indoor maps from computer-assisted-design (CAD) files, the method comprising operating a processor to:

receive a set of CAD files relating to a facility;

for each CAD file of the set, classify the CAD file as a site plan or a floor plan;

define one or more layers of at least one electronic map for the facility based on the set of CAD files;

for each CAD file of the set, generate an electronic map, the electronic map including one or more layers, each layer including at least one object;

align objects in the electronic map for the facility, based on the layer of the object by:

identifying common geometry objects that are common to the site plan and one or more floor plans;

rendering an image of the site plan using a first scaling factor to draw the common geometry objects; and for each floor plan:

rendering an image of the floor plan using the first scaling factor to draw the common geometry objects;

determining a transformation that aligns the image of the floor plan with the image of the site plan; and applying the transformation to each common geometry object of the floor plan in the electronic map;

for each CAD file of the set, assign text data in that CAD file to an object in the electronic map file of that CAD file; and store the at least one electronic map for the facility on at least one data storage memory.

14. The method of claim 13, wherein operating the processor to generate an electronic map further comprises operating the processor to:

extract one or more CAD content from the CAD file, the one or more CAD content comprising at least one layer and at least one entity;

for each of the at least one layer, classify the layer as being visible or non-visible for the electronic map;

determine a drawing context for the electronic map from the one or more CAD content;

generate an internal data representation of the CAD file by mapping each of the at least one entity to an object in the electronic map; and draw geometry based on the internal data representation of the CAD file and the drawing context to provide the electronic map.

15. The method of claim 14, wherein operating the processor to draw geometry based on the internal data representation of the CAD file and the drawing context to provide the electronic map further comprises operating the processor to draw geometry based on pre-defined color settings.

16. The method of claim 13, wherein operating the processor to classify the CAD file comprises operating the processor to:

receive a latitude and longitude of the facility;

retrieve satellite imagery of the latitude and longitude of the facility; and segment the facility from the retrieved satellite imagery to use as the site plan.

17. The method of claim 16, wherein operating the processor to segment the facility from the retrieved satellite imagery segmenting the facility from the retrieved satellite imagery comprises operating the processor to:

segment one or more buildings from the retrieved satellite imagery;

align each of the one or more segmented buildings to a floor of a CAD file in the set; and identify the segmented building having a smallest alignment difference as the facility.

18. The method of claim 17, wherein operating the processor to identify the segmented building having a smallest alignment difference as the facility further comprises operating the processor to:

compare the alignment difference with a pre-determined alignment threshold; and only identify the segmented building as the facility if the alignment difference is less than the pre-determined alignment threshold.

19. The method of claim 13, wherein operating the processor to define the one or more layers based on the set of CAD files defining the one or more layers based on the set of CAD files further comprises operating the processor to define a layer based on one or more entities detected in the CAD file, the one or more shapes representing one or more physical features of the facility.

20. The method of claim 13, wherein operating the processor to define the one or more layers based on the set of CAD files defining the one or more layers based on the set of CAD files further comprises operating the processor to define a salient layer based on text detected in the CAD file and associated with a region within the CAD file.

21. The method of claim 13, wherein operating the processor to classify the CAD file and define the one or more layers based on the set of CAD files comprises operating the processor to generate a site configuration file for storing the classification of files and the definition of one or more layers and store the site configuration file on the at least one data storage memory.

22. The method of claim 13, wherein operating the processor to determine a transformation that aligns the image of the floor plan with the image of the site plan comprises operating the processor to:

use a Fourier-Mellin transform to generate a polar spectrum decomposition;

locate a largest peak in the polar spectrum decomposition; and use a rotation, location, and scaling factor at the largest peak as the transformation that aligns the image of the floor plan with the image of the site plan.

23. The method of claim 13, wherein operating the processor to assign text data in the CAD file to an object in the electronic map for that CAD file comprises operating the processor to:

extract one or more closed polygons from the floor plan;

extract one or more text strings from the floor plan, each text string comprising a location identifier; and associate each of the one or more location identifiers with a polygon of the one or more polygons.

24. The method of claim 23, wherein operating the processor to associate each of the one or more location identifiers with a closed polygon of the one or more closed polygons comprises operating the processor to assign each location identifier to a polygon with at least one of minimal distance and maximal overlap.

* * * * *